United States Patent
Abe et al.

[11] Patent Number: 5,903,854
[45] Date of Patent: May 11, 1999

[54] HIGH-FREQUENCY AMPLIFIER, TRANSMITTING DEVICE AND RECEIVING DEVICE

[75] Inventors: Masayoshi Abe; Tomoya Yamaura, both of Tokyo; Katsuyuki Oshiba, Kanagawa, all of Japan

[73] Assignee: Sony Corporation, Tokyo, Japan

[21] Appl. No.: 08/636,405

[22] Filed: Apr. 23, 1996

[30] Foreign Application Priority Data

Apr. 27, 1995 [JP] Japan .................................... 7-125651

[51] Int. Cl.⁶ ...................................................... H04B 1/38
[52] U.S. Cl. ......................... 455/575; 455/73; 455/127; 330/295; 330/124 R
[58] Field of Search ................................. 455/73, 84, 88, 455/558, 575, 572, 91, 127; 330/295, 278, 279, 129, 124 R, 277, 296

[56] References Cited

U.S. PATENT DOCUMENTS

| | | | |
|---|---|---|---|
| 4,794,343 | 12/1988 | Yang | 330/2 |
| 4,890,016 | 12/1989 | Tanaka et al. | 307/443 |
| 4,959,873 | 9/1990 | Flynn et al. | 455/303 |
| 5,256,987 | 10/1993 | Kibayashi et al. | 330/295 |
| 5,477,184 | 12/1995 | Uda et al. | 327/404 |
| 5,530,404 | 6/1996 | Debroux | 330/278 |
| 5,548,246 | 8/1996 | Yamamoto et al. | 330/51 |
| 5,561,395 | 10/1996 | Melton et al. | 330/2 |
| 5,646,577 | 7/1997 | Ishikura | 330/279 |

FOREIGN PATENT DOCUMENTS 1314431 12/1989 Japan .
5167364 7/1993 Japan .
0693631 11/1994 Japan .

OTHER PUBLICATIONS

W.C. Tsai, A 5watt c–Band Fet amplifier, IEEE, pp. 285–287, Jul. 1978.
Japanese Patent JP01–314431A.
Japanese Patent JP06–93631B.

Primary Examiner—Reinhard J. Eisenzopf
Assistant Examiner—Darnell R. Armstrong
Attorney, Agent, or Firm—Jay H. Maioli

[57] ABSTRACT

A radio frequency amplifier, for amplifying a radio frequency signal, comprises a plurality of active element groups, each comprising one or more active elements for amplifying a signal, with input terminals of said one or more active elements being combined to form a single input terminal and output terminals of said one or more active elements being combined to form a single output terminal and bias control means for controlling bias conditions of said plurality of active element groups arranged in such a manner that at low power output deterioration of the gain and distortion characteristics of the amplifier is avoided and sufficiently low power consumption can be achieved by switching the bias voltages of each of the active element groups of the high-frequency amplifier individually between an operating voltage and an off voltage.

19 Claims, 23 Drawing Sheets

INPUT/OUTPUT CHARACTERISTICS OF
TRANSMISSION POWER AMPLIFIER

FIG. 19

| FET group # | operating conditions for each FET group | | | | | | |
|---|---|---|---|---|---|---|---|
| #1 | on | on | on | on | off | off | off |
| #2 | on | on | off | off | on | on | off |
| #3 | on | off | on | off | on | off | on |
| drain current | Idmax | 6/7 Idmax | 5/7 Idmax | 4/7 Idmax | 3/7 Idmax | 2/7 Idmax | 1/7 Idmax |

| ///// | UPPER LAYER METAL LAYER |
| ☐ | LOWER LAYER METAL LAYER |

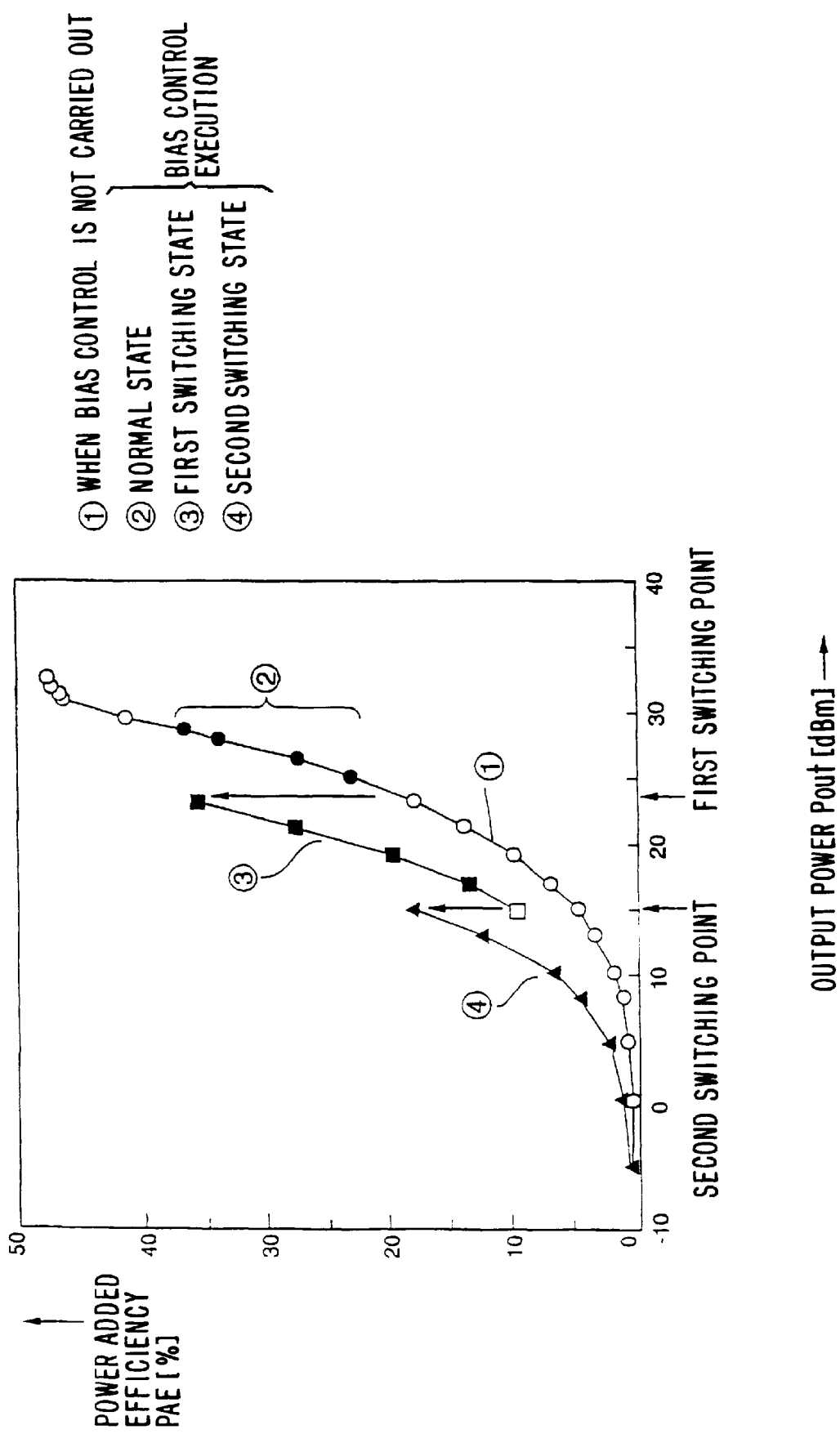

HIGH-FREQUENCY AMPLIFIER, TRANSMITTING DEVICE AND RECEIVING DEVICE

BACKGROUND OF THE INVENTION

The present invention relates to a transmitter device, receiver device, and high-frequency amplifier employed in these devices, and is particularly suitable for transmitter devices for carrying out transmission power control or receiving devices for changing receiving power levels.

FIG. 1 shows a typical block structure of a receiving system and a transmitting system for a wireless communications terminal. First, the receiving system is constructed as follows.

Electromagnetic waves received by an antenna 61 are provided to a receiver amplifier 63 by a duplexer 62 after having been converted into a high-frequency electrical signal. A high-frequency electrical signal amplified by the receiver amplifier 63 is made into an intermediate frequency signal by mixing with a local frequency from a local oscillator 65 at a mixer 64. The gain of this intermediate frequency signal is controlled by an intermediate frequency variable gain amplifier 66. In particular, the output level of the intermediate frequency variable gain amplifier 66 is detected by the coupler 68a and the AGC 68 variably controls the gain of the intermediate frequency variable gain amplifier 66 in response to the detected level so that an AGC (Automatic Gain Control) operation can be carried out for the intermediate frequency variable gain amplifier 66.

The AGC 68 generates received signal strength information S1 from the output level of the intermediate frequency variable gain amplifier 66.

The output of the intermediate frequency variable gain amplifier 66 is demodulated by a demodulator 67 to give a baseband signal. This baseband signal is then provided to a baseband signal processor 69, with a speaker 69a then being driven, and audio being outputted.

The transmission system is constructed as follows. First, the audio signal is converted into an electrical signal by a microphone 69b. This output is then provided to a baseband signal processor 69.

A transmission baseband signal outputted from the baseband signal processor 69 is modulated at a modulator 71 and is then amplified at a prescribed gain at an intermediate frequency variable gain amplifier 72. This signal is then mixed with a local frequency from a local oscillator 65 at a mixer 73 to give a high-frequency signal (wireless frequency signal) and is amplified at a radio frequency variable gain amplifier 74. The signal is then amplified at a transmission power amplifier 75, provided to the antenna 61 from a duplexer 62, and is transmitted.

Transmission systems constructed in such a manner that transmission power control is carried out based on received signal strength level information S1 or based on an instruction signal S2 from a remote station such as a base station are common.

For example, an instruction signal S2 included in a receiving signal is provided to a controller 70 after being demodulated at the baseband signal processor 69. The controller 70 then outputs an instruction to a transmission power controller 76 based on the instruction signal S2. The transmission power controller 76 generates transmission power control information S3 based on an instruction from the controller 70 and provides this to the intermediate frequency variable gain amplifier 72 and the radio frequency variable gain amplifier 74. The gain of the amplifying operation is then set-up at the intermediate frequency variable gain amplifier 72 and the radio frequency variable gain amplifier 74 based on the transmission power control information S3.

Alternatively, constructions are also known where transmission power control information S3 is generated based on the receiving signal strength level S1 from the AGC 68 and this is then provided to the intermediate frequency variable gain amplifier 72 and the radio frequency variable gain amplifier 74.

Cases where control of transmission power is carried out using these means on the transmission side are common.

The input signal level to the receiver amplifier 63 is changed at the receiving system depending on the distance to the base station which sent the signal and the base station transmitted signal level. Because of this, the aforementioned AGC control can be used to provide a degree of compatibility with fluctuations in the level of the received signal.

However, in the case of carrying out transmission power control, considering the efficiency for the transmission power amplifier 75 which is the stage following the radio frequency variable gain amplifier 74, there is a problem where there is unnecessary consumption of electric power. Similarly, the operation of the receiver amplifier 63 in response to changes in the receiving signal level strength is not efficient. This problem is described taking the example of the transmission power amplifier 75.

An example of the characteristics of the output power Pout and the Power Added Efficiency PAE for the input power Pin of the transmission power amplifier 75 is shown in FIG. 2.

As can be seen from the drawing, the output power Pout and the Power Added Efficiency PAE increase as the input power Pin increases.

Considering the case where the input power Pin at the transmission power amplifier 75 is lowered due to transmission power control, the Power Added Efficiency PAE is dramatically reduced, as shown in the drawing. For example, the Power Added Efficiency is about 1% when the output is 10 mW, that is 10 dBm and the total power consumption is 1 W. Thus, 990 mW is power dissipated as heat, with there being large room for improvement with regards to lower power consumption.

Technology where a bias voltage or current provided to the transmission power amplifier 75 is controlled in response to transmission power control information S3 is disclosed in, for example, Japanese Laid-Open Patent Publication No. Hei 1-314431 and Japanese Patent Publication Hei. 6-93631 as high efficiency methods for the transmission power amplifier 75 at the time of low output power.

These related bias control methods are described in the following.

An example is given in FIG. 3 where the efficiency at the time of low transmission output is improved by controlling the gate bias of the transmission power amplifier 75 using this transmission power control information S3 while the gain of the intermediate frequency variable gain amplifier 72 and the radio frequency variable gain amplifier 74 is controlled based on the transmission power control information S3.

With the transmission power amplifier 75 of this example, the input power Pin is amplified by an FET 81 at a first stage amplifier via a matching circuit 80a before being further amplified at an FET 82 at a second stage amplifier via a matching circuit 80b. The signal is then outputted as the output power Pout via the matching circuit 80c.

Gate voltages Vg1 and Vg2 are provided to the gates of FET 81 and FET 82 via gate resistors Rg1 and Rg2. Drain voltages Vd1 and Vd2 are applied to the drains for FET 81 and FET 82 and drain currents Id1 and Id2 are made to flow via the choke coils Ld1 and Ld2. The sources of the FETs 81 and 82 are connected to ground.

The gate voltages Vg1 and Vg2 are generated by a gate bias control circuit 83. The gate bias control circuit 83 sets up the values for the gate voltages Vg1 and Vg2 based on the transmission power control information S3.

In this example, the drain current Id can be lowered by changing the value of the voltage Vgs across the gate and source from Vg-on to Vg-on1 as shown in the graph of the voltage Vgs across the gate and source versus the drain current Id of FIG. 4.

The case is considered where the gain of the intermediate frequency variable gain amplifier 72 and the radio frequency variable gain amplifier 74 is controlled based on the transmission power control information S3 and the input power Pin for the transmission power amplifier 75 is small, that is the case during low power is considered. The efficiency can be improved during this kind of low power output by having the drain current Id fall by making the value for the gate voltage Vg of the transmission power amplifier 75 change from Vg-on to Vg-on1 because the desired output can be obtained even if the drain current Id falls.

In this case, as can be understood from FIG. 4, when the value of the voltage Vgs across the gate and source is lowered from Vg-on to Vg-on1, the gain is lowered and the distortion characteristic is inferior because the characteristic for the voltage Vgs across the gate and source versus the drain current Id is not the ideal straight line characteristic. Because of this, considering the permitted gain reduction and distortion characteristics, the reduction from the value Vg-on to the value Vg-on1, i.e. the value taken as Vg-on cannot but be set up and in reality, and the reduction width (control scope of the gate voltage of FIG. 4) cannot be made very large. The drain current Id can therefore not be made too low during low transmission output and the achieved efficiency results will be small.

Another example is shown in FIG. 5. In this example, the structure of the transmission power amplifier 75 is almost the same as that in FIG. 2. However, the gate voltages Vg1 and Vg2 are taken to be fixed values and drain voltages Vd1 and Vd2 are generated by a drain bias control circuit 84. The drain bias control circuit 84 sets up voltage values as the drain voltages Vd1 and Vd2 based on the transmission power control information S3.

The drain current can be lowered and low power consumption can be achieved in this case also during low transmission output by lowering the drain voltage Vd1 and Vd2.

As shown in the graph of the gate/source voltage Vgs and the drain current Id of FIG. 6, the drain current is lowered from the drain current Ids-on to Ids-on1 by changing the value of the drain voltage Vd from Vds-h to Vds-1.

However, the actual scope of variation must also be limited in the case of this method because of lowering of the gain and deterioration of distortion characteristics and only a small improvement in efficiency can be achieved (resulting consumption at low power). In particular, in recent years there has been a tendency for the drain voltage Vds to become lower, with the variable scope of the drain bias therefore becoming smaller accordingly.

Further, there is also a method where the examples of FIG. 3 and FIG. 5 are combined. Naturally, a dramatic improvement in the efficiency results was not achieved.

These related examples where shown in the drawings with single FET elements as the FETs 81 and 82 of FIG. 3 and FIG. 5. However, in reality, the FETs 81 and 82 etc. are constructed as FETs capable of high outputs where a plurality of FET units (FET-1, FET-2, . . . FET-n) are arranged in parallel as shown in FIG. 7.

The structure of these kinds of FET elements when viewed from above is as shown, for example, in FIG. 8.

The signal from the matching circuit 80a of FIG. 7 is inputted to a gate line Gc formed as an upper layer metal layer in FIG. 8. Further, a gate voltage Vg is applied at the gate line Gc via a portion comprising a gate resistance Rg. Eight gate electrodes G1 to G8 are then lead-out from the gate line Gc.

Further, drain electrodes D1 to D4 are formed as lower metal layers, with these drain electrodes D1 to D4 all being connected to a drain line Dc present at the upper metal layer. The drain line Dc is the output line for the FET 81 of FIG. 7.

Moreover, source electrodes S1 to S5 are formed as lower metal layers and are all connected to a source line Sc present at the upper layer metal layer. The source line Sc is then connected to ground.

In this case, drain electrodes and source electrodes are positioned on both sides of each of the gate electrodes G1 to G8. In this way, 8 FET units (FET-1, FET-2 . . . FET-8) are formed.

As the present invention sets out to resolve the aforementioned problems, the object of the present invention is to provide a high-frequency amplifier, transmitting device and receiving device which is simpler and which can achieve dramatically lower power consumption.

SUMMARY OF THE INVENTION

In order to achieve the aforementioned objects of the present invention, a radio frequency amplifier, for amplifying a radio frequency signal, comprises a plurality of active element groups, each comprising one or more active element (s) for amplifying a signal, with input terminals of the one or more active element(s) being combined to form a single input terminal and output terminals of the one or more active element(s) being combined to form a single output terminal, and a bias controller for controlling bias conditions of the plurality of active element groups.

Further, according to the present invention, a transmitter for transmitting radio waves comprises a baseband signal processor for processing a baseband signal, modulator for modulating a predetermined signal using the baseband signal; and a power amplifier for amplifying a radio frequency signal comprising; a plurality of active element groups, each comprising one or more FET(s) for amplifying a signal, with input terminals of the one or more FET(s) being combined to form a single input terminal and output terminals of the one or more FET(s) being combined to form a single output terminal, and a bias controller for controlling gate bias or drain voltages of the FET(s) of the plurality of active element groups.

Moreover, according to the present invention, a receiver for receiving radio waves comprises a radio frequency amplifier for amplifying a received radio frequency signal comprising; a plurality of active element groups, each comprising one or more FET(s) for amplifying a signal, with input terminals of the one or more FET(s) being combined to form a single input terminal and output terminals of the one or more FET(s) being combined to form a single output terminal, and bias controller for controlling gate bias or drain voltages of the FET(s) of the plurality of active element groups; a demodulator for demodulating an output signal of the radio frequency amplifier; and a baseband signal processor for processing an output signal of the demodulator.

Still further, according to the present invention, a transceiver for transmitting and receiving radio waves comprises a transmitting section comprising baseband signal processor for processing a baseband signal, a modulator for modulating a predetermined signal using the baseband signal and a power amplifier for amplifying a radio frequency signal comprising; a plurality of active element groups, each comprising one or more FET(s) for amplifying a signal, with input terminals of the one or more FET(s) being combined to form a single input terminal and output terminals of the one or more FET(s) being combined to form a single output terminal, and a bias controller for controlling gate bias or drain voltages of the FET(s) of the plurality of active element groups and a receiving section comprising a plurality of active element groups, each comprising one or more FET(s) for amplifying a signal, with input terminals of the one or more FET(s) being combined to form a single input terminal and output terminals of the one or more FET(s) being combined to form a single output terminal, and a bias controller for controlling gate bias voltages of the FET(s) of the plurality of active element groups, demodulator for demodulating an output signal of the radio frequency amplifier and a baseband signal processor for processing an output signal of the demodulator.

Moreover, according to the present invention, a method of controlling a status of a radio frequency amplifier comprises a command sending step of sending on or off signals to a plurality of bias controlling lines and a current providing step for providing currents for FETs in accordance with the on or off signal in the form of binary notation.

BRIEF DESCRIPTION OF THE DRAWINGS

FIG. 19 illustrates the controllable stages in the case in the above embodiments where each of the FET groups are formed using the same number of FETs;

FIG. 24 is a view illustrating the efficiency results for the embodiments.

DETAILED DESCRIPTION OF THE PREFERRED EMBODIMENTS

First Embodiment

1. Example structure (1) of transceiver of this embodiment

Figure 9:
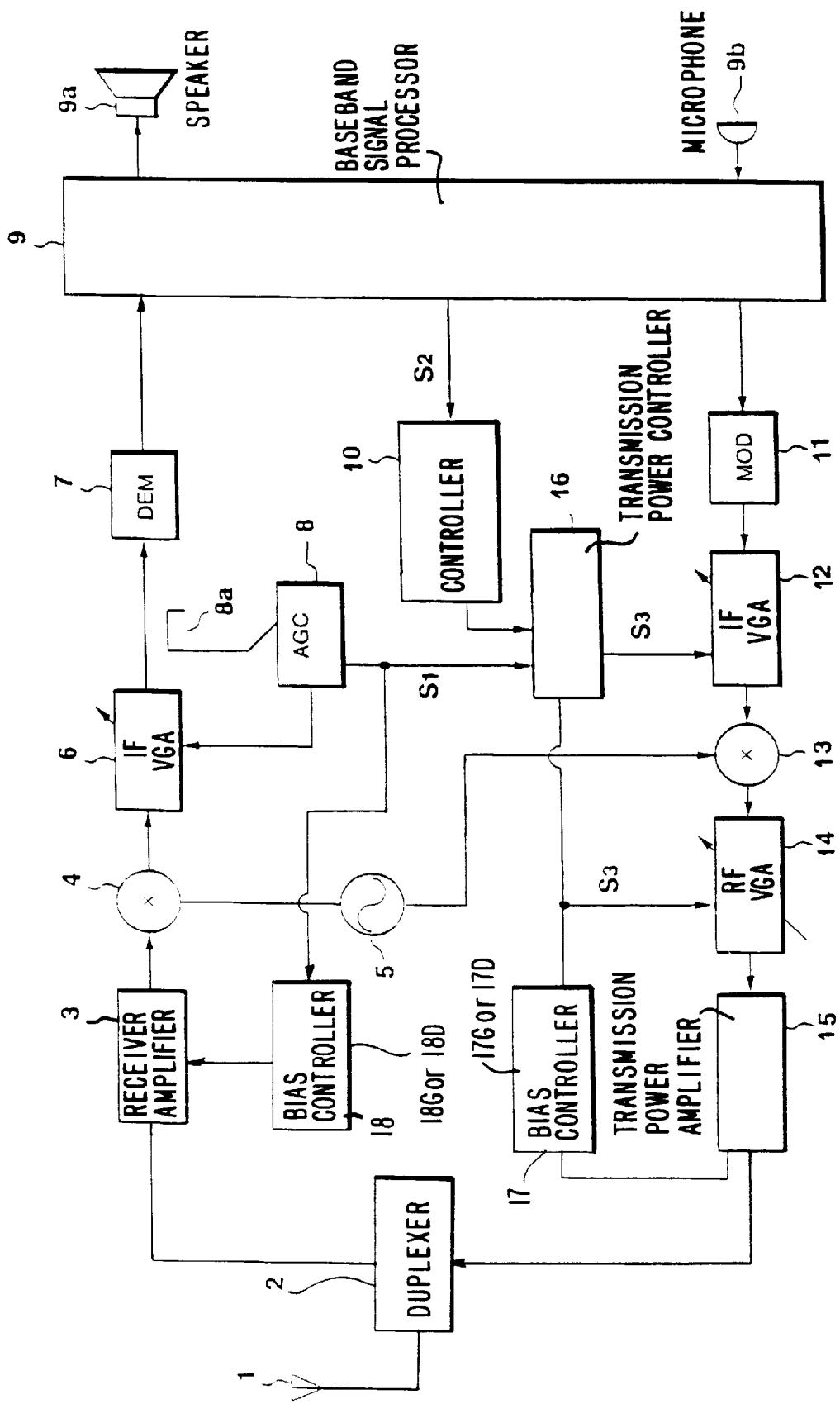
FIG. 9 is a block diagram of a transmitting and receiving device of an embodiment of the present invention.

FIG. 9 is a block diagram showing the structure of a transceiver of this embodiment. The receiving system is constructed as follows.

Electromagnetic waves received by an antenna 1 are provided to a receiving amplifier 3 by a duplexer 2. A high-frequency signal amplified by the receiving amplifier 3 is made into an intermediate frequency signal by mixing with a local frequency from a local oscillator 5 at a mixer 4. The gain of this intermediate frequency signal is controlled by an intermediate frequency variable gain amplifier 6. In particular, the output level of the intermediate frequency variable gain amplifier 6 is detected by the coupler 8a and the AGC 8 variably controls the gain of the intermediate frequency variable gain amplifier 6 in response to the detected level so that an AGC (Automatic Gain Control) operation can be carried out for the intermediate frequency variable gain amplifier 6.

The AGC 8 generates received signal strength information S1 from the output level of the intermediate frequency variable gain amplifier 6.

The output of the intermediate frequency variable gain amplifier 6 is demodulated by a demodulator 7 to give a baseband signal. This baseband signal is then provided to a baseband signal processor 9, provided to a speaker 9a, and put into the form of an audio signal.

The transmission system is constructed as follows. The audio signal is converted into an electrical signal by a microphone 9b and provided to the baseband signal processor 9. A transmission baseband signal outputted from the baseband signal processor 9 is modulated at a modulator 11 and is then amplified at a prescribed gain at an intermediate frequency variable gain amplifier 12. This signal is then mixed with a local frequency from a local oscillator 5 at a mixer 13 to give a high-frequency signal (radio frequency signal) and is then amplified at a radio frequency variable gain amplifier 14. The signal is then amplified at a transmission power amplifier 15, provided to the antenna 1 from a duplexer 2, and is transmitted as electromagnetic waves.

This receiving system is constructed in such a manner that transmission power control is carried out based on received signal strength level information S1 or an instruction signal S2 from a remote station such as a base station. Namely, the instruction signal S2 included in the received signal is provided to a controller 10 after being decoded at the baseband signal processor 9. The controller 10 outputs an instruction to a transmission power controller 16 based on the instruction signal S2. The transmission power controller 16 generates and provides to the intermediate frequency variable gain amplifier 12 and the radio frequency variable gain amplifier 14 transmission power control information S3 based on an instruction from the controller 10. The gain of the amplifying operation is then set-up at the intermediate frequency variable gain amplifier 12 and the radio frequency variable gain amplifier 14 based on the transmission power control information S3.

The transmission power controller 16 can also be constructed in such a manner as to generate and provide to the intermediate frequency variable gain amplifier 12 and the radio frequency variable gain amplifier 14 transmission power control information S3 using received signal strength level information S1 from the AGC 8.

A bias controller 17 for carrying out bias control for the transmission power amplifier 15 is provided at the duplexer of this embodiment. The bias controller 17 is constructed from a circuit part (gate bias controller) for controlling the gate bias of an FET in the transmission power amplifier is or a circuit part (drain bias controller) for controlling the drain bias of an FET.

Transmission power control information S3 is provided for this bias controller 17. The bias controller 17 sets-up the bias of the transmission power amplifier 15 in response to the transmission power control information S3.

The duplexer of this embodiment consumes little power at the time of low power output by having the bias controller 17 carry out bias control for the transmission power amplifier 15 in response to the transmission power control information S3.

The level of the input signal to the receiving amplifier 3 changes in accordance with the distance to the remote station which transmitted the signal and the remote station transmission signal level. However, a bias controller 18 is provided for carrying out bias control for the receiving amplifier 3 when the received signal strength level and the level of the signal inputted to the receiving amplifier 3 is low in such a manner that wasteful power consumption does not occur. The bias controller 18 is constructed from a circuit part (gate bias controller) for controlling the gate bias of an FET in the receiving amplifier 3 or a circuit part (drain bias controller) for controlling the FET drain bias.

Received signal strength level information S1 is provided for this bias controller 18, which then sets up the bias of the receiving amplifier 3 in response to this received signal strength level information S1.

The bias controller 18 and the receiving amplifier 3 comprise the high-frequency amplifier of this embodiment and will be described in detail later.

2. Example structure (2) of the duplexer of this embodiment

Figure 10:
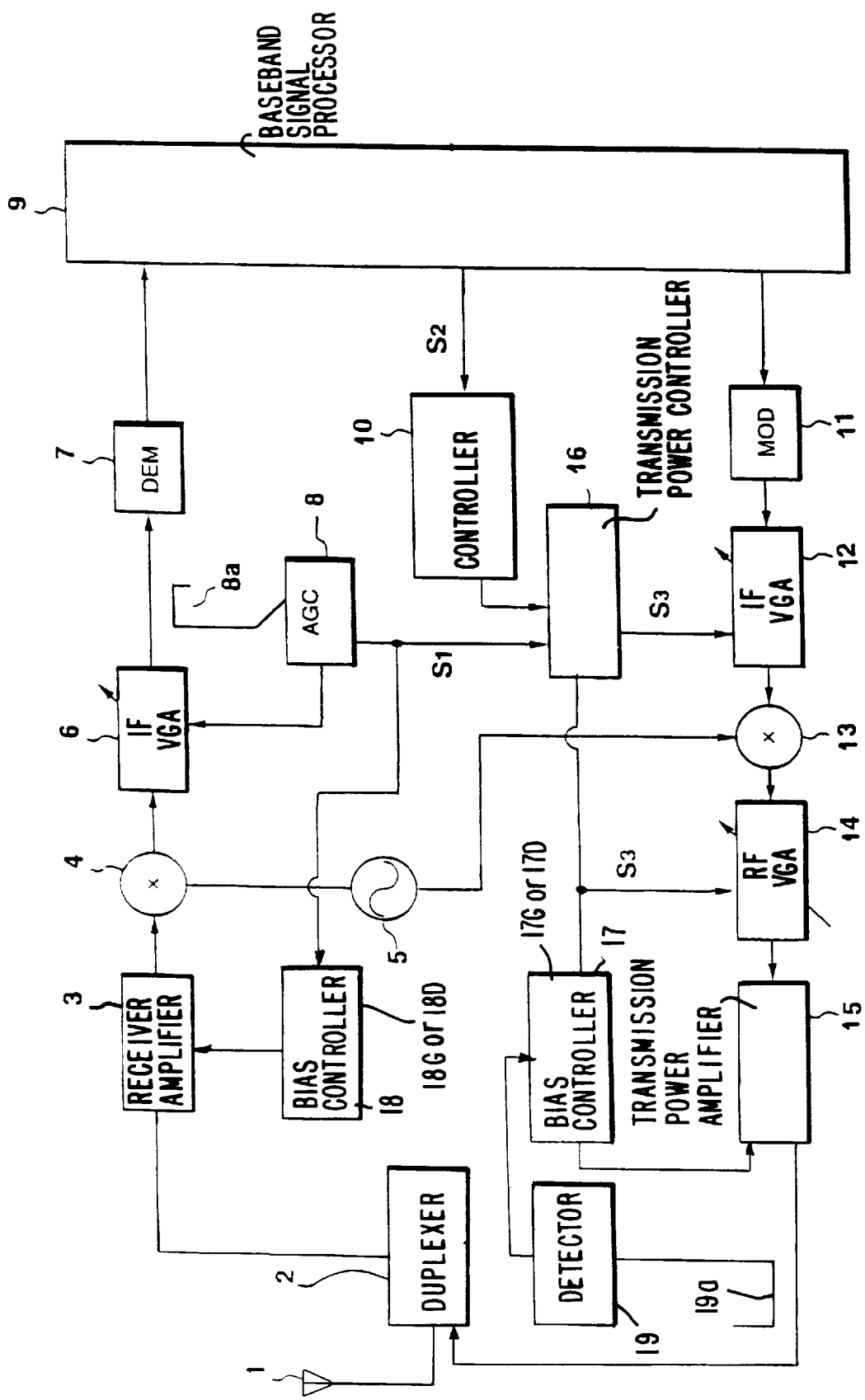
FIG. 10 is a block diagram of a transmitting and receiving device of a further embodiment of the present invention.

FIG. 10 shows a further example taken as an example structure of the duplexer of this embodiment.

In this case, the source providing control information to the bias controller 17 is different from that of FIG. 9, with other aspects being the same as for FIG. 9.

Namely, a coupler 19a and a detector 19 are provided for detecting the output level of the transmission power amplifier 15.

Signal level information detected by the detector 19 is provided to the bias controller 17, with the bias controller 17 then setting up the bias of the transmission power amplifier 15 in response to this signal level information.

Effective low power consumption results can be obtained at the time of low transmission output with this transmitting and receiving device even with this kind of method.

3. Example structure (1) of transmission power amplifier as the high-frequency amplifier of this embodiment The following is a description of an embodiment where the high-frequency amplifier is comprised of the bias controller 17 and the transmission power amplifier 15 shown in FIG. 9. A description is given in the following where each of the embodiments can be applied to the transmitting and receiving device of FIG. 9 and the embodiments can also be applied to the transmitting and receiving device of FIG. 10.

Figure 11:
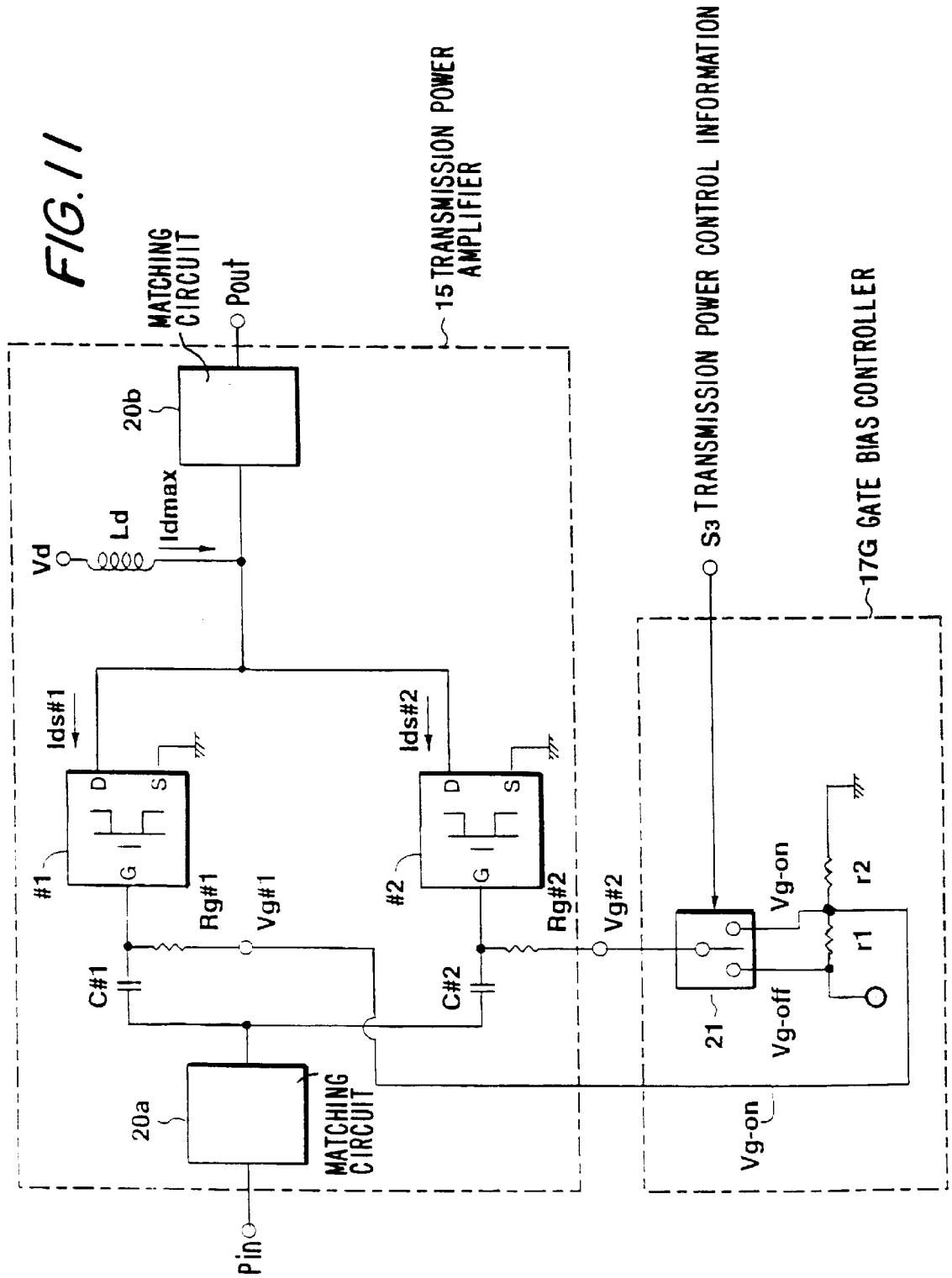
FIG. 11 is a view illustrating a high-frequency amplifier of the first embodiment of the present invention.

The structure for the high-frequency amplifier is shown in FIG. 11. This high-frequency amplifier is constructed from the gate bias controller 17G and the transmission power amplifier 15.

The transmission power amplifier 15 in this high-frequency amplifier comprises matching circuits 20a and 20b, FET groups #1 and #2, DC blocking capacitors C#1 and C#2, gate resistors Rg#1 and Rg#2 and a high-frequency choke coil Ld.

At this transmission power amplifier 15, the input power Pin is amplified at FET groups #1 and #2 via the matching circuit 20a and outputted as the output power Pout via the matching circuit 20b.

The FET groups #1 and #2 are constructed from a plurality of FET units. For example, an example is shown in FIG. 12 where the FET groups #1 and #2 each comprise four FET units (FET-1 to FET-4).

Figure 12:
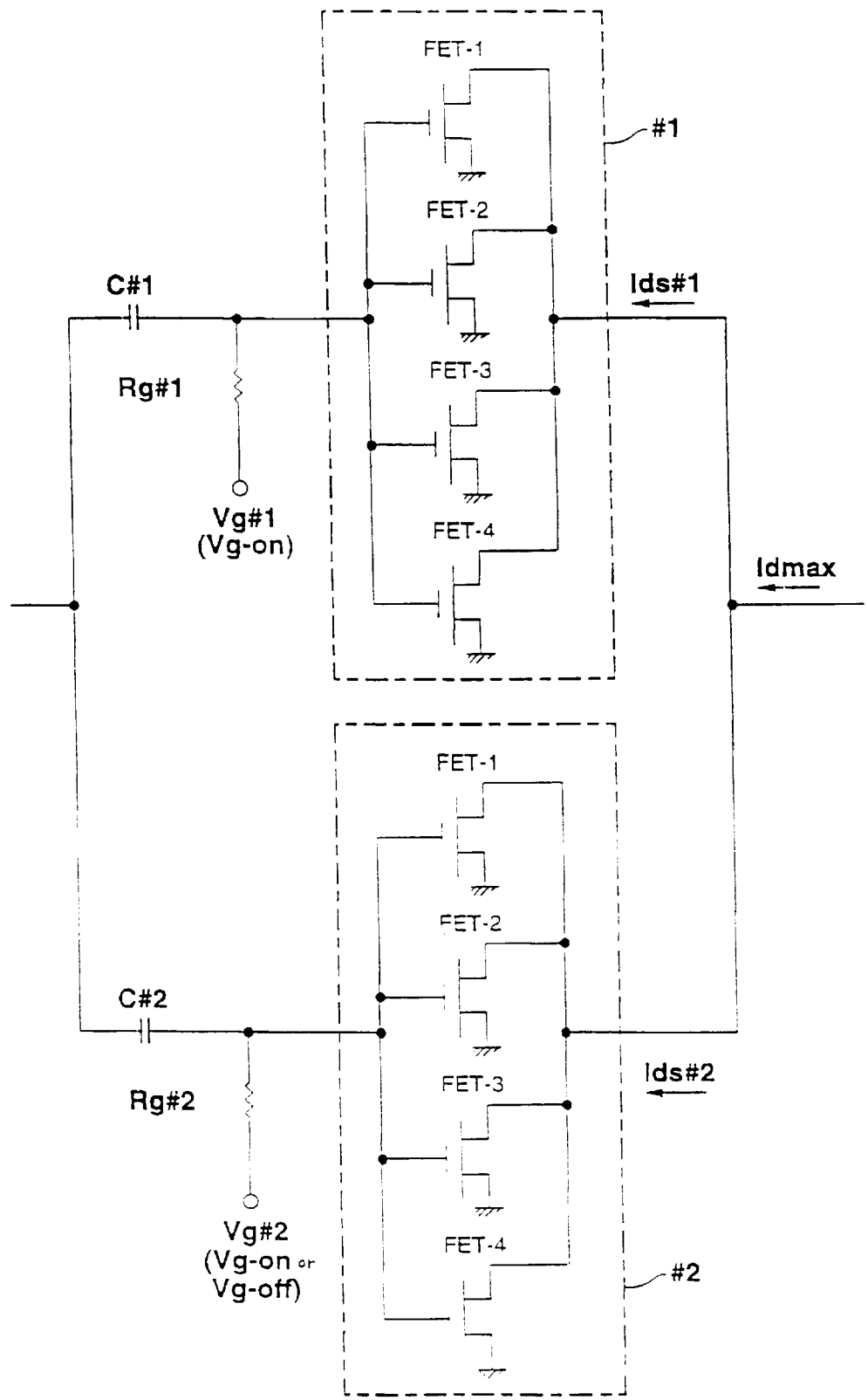
FIG. 12 is a structural drawing of an FET group occurring in a high-frequency amplifier of an embodiment of the present invention.

As can be seen from FIG. 12, the gates of each of the FET units (FET-1 to FET-4) within each of the FET groups #1 and #2 are connected, as are the drains, with the sources being connected to ground.

As can be seen from FIG. 11 and FIG. 12, the gate electrodes of the FET groups #1 and #2 are separated with respect to DC by DC blocking capacitors C#1 and C#2 but are connected with respect to high frequencies.

Further, gate resistors Rg#1 and Rg#2 are connected at the respective gate electrodes of the FET groups #1 and #2 so as to obtain high-frequency isolation with the bias providing side (gate bias controller 17G). The gate resistors Rg#1 and Rg#2 can be replaced with a high-frequency choke coil or a short stub equivalent to a high-frequency choke coil.

On the other hand, the drain electrodes of FET group #1 and FET group #2 are connected. A drain current Idmax can then be obtained via a high-frequency choke coil Ld by applying a constant drain voltage Vd.

A drain current Idmax indicates the amount of current obtained when an operating gate voltage is being applied to both the FET group #1 and the FET group #2.

Gate voltages Vg#1 and Vg#2 for the FET group #1 and the FET group #2 are provided by the gate bias controller 17G.

An operating gate voltage Vg-on and a gate off voltage Vg-off which is less than a pinch-off voltage Vp are obtained at the gate bias controller 17G by, for example, voltage dividing using the resistors r1 and r2.

An operating gate voltage Vg-on is provided to the FET group #1 as the gate voltage Vg#1 via the gate resistor Rg#1.

The operating gate voltage Vg-on and the off gate voltage Vg-off are provided to each terminal of a single pole two-way switch 21. This switch 21 is connected to the gate resistor Rg#2. Namely, a voltage selected at the switch 21 is provided to the FET group #2 as the gate voltage Vg #2.

The switch 21 is changed over by the transmission power control information S3. Namely, when the transmission power is in a high transmission output state, the operating gate voltage Vg-on is selected at the switch 21, with this being taken to be the gate voltage Vg#2 for the FET group #2. However, during the low transmission output state, the off gate voltage Vg-off is selected at the switch 21, with this being taken as the gate voltage Vg#2 for the FET group #2.

With this kind of high-frequency amplifier, when the transmission power is set up to be high by the transmission power control information S3, that is when the gain of the intermediate frequency variable gain amplifier 12 and the radio frequency variable gain amplifier 14 is set up to be high and the power Pin inputted to the transmission power amplifier 15 is set to be high, the switch 21 is switched over to the side of the operation gate voltage Vg-on based on this transmission power control information S3.

Each of the FET groups #1 and #2 function together as an amplifying operation part so as to give an amplifier circuit capable of high level output.

On the other hand, when the transmission power is set up to be low by the transmission power control information S3, that is when the gain of the intermediate frequency variable gain amplifier 12 and the radio frequency variable gain amplifier 14 in FIG. 9 is set up to be low and the power Pin inputted to the transmission power amplifier 15 is low (for example, less than a half), the switch is switched over to the off gate voltage Vg-off side based on the transmission power control information S3.

As a result, the gate voltage Vg#2 of the FET group #2 is the off gate voltage Vg-off. The off gate voltage Vg-off is therefore a voltage value less than the pinch off voltage Vp shown in FIG. 4, that is in this case, the FET group #2 side drain current Ids#2 becomes zero and the FET group #2 goes into the off state.

Namely, at this time, only the drain current Ids#1 is flowing as the total drain current because only the FET group #1 is operating. The amount of drain current is half that at the time of the high transmission output with the FET group #2 on.

The required output is obtained from the FET group #1 regardless of the drain current having become half because the signal level taken as the input power Pin is low. Further, a sufficient distortion characteristic is maintained because normal operation does not change at the FET group #1. Because of this, the amplifying efficiency is doubled and considerably lower power consumption can be achieved.

Second Embodiment

4. Example structure (2) of a transmission power amplifier as a high-frequency amplifier of the embodiment Next, a second embodiment of a high-frequency amplifier comprised of the bias controller 17 and the transmission power amplifier 15 shown in FIG. 9 will be described using FIG. 13.

The high-frequency amplifier is constructed from a gate bias controller 17G and a transmission power amplifier 15.

The transmission power amplifier 15 of this high-frequency amplifier comprises matching circuits 20a and 20b, FET groups #1, #2, . . . #N, DC cutting capacitors C#1, C#2, . . . C#N, gate resistors Rg#1, Rg#2, . . . Rg#N, and a high-frequency choke coil Ld.

At this transmission power amplifier 15, the input power Pin is amplified at the FET groups #1, #2, . . . #N via the matching circuit 20a, before being outputted via the matching circuit 20b as the output power Pout.

Namely, in this embodiment, a plurality of unit FET elements are divided into N FET groups #1, #2, . . . #N.

Each of the gate electrodes of the FET groups #1, #2, . . . #N are isolated with respect to DC by DC cutting capacitors C#1, C#2, . . . C#N but are connected with respect to high frequencies.

Further, gate resistors Rg#1, Rg#2, . . . Rg#N are connected to the respective gate electrodes of the FET groups #1, #2, . . . #N in order to provide high-frequency isolation with the bias providing side (gate bias controller 17G).

On the other hand, the drain electrodes of the FET groups #1, #2, . . . #N are connected. A drain current Idmax is obtained via the high-frequency choke coil Ld by applying a fixed drain voltage Vd.

In this case, taking the number of unit FETs comprising each of the FET groups #1, #2, . . . #N to be the same, the amount of drain current flowing through the FET groups #1, #2, . . .#N becomes Idmax/N.

The gate voltages Vg#1 to Vg#N for each of the FET groups #1 to #N are provided by the gate bias controller 17G.

An operating gate voltage Vg-on and an off gate voltage Vg-off less than the pinch off voltage Vp are obtained at the gate bias controller 17G and an operating gate voltage Vg-on is provided to the FET group #1 via the resistor Rg#1 as the gate voltage Vg#1.

On the other hand, operating gate voltages Vg-on and off gate voltages Vg-off are provided to each of the terminals of the single-pole two stage switches 22-2 to 22-N, with the switches 22-2 to 22-N being connected to the respective gate resistors Rg#2 to Rg#N of the respective FET groups #2 to #N. Voltages selected at the respective switches 22-2 to 22-N are provided as the gate voltages Vg#2 to Vg#N for the FET groups #2 to #N.

Each of the switches 22-2 to 22-N can be individually switched over by the switch controller 24 in response to the values of the respective items of transmission power control information S3. This is to say that, in this embodiment, the FET groups providing the operation gate voltages Vg-on can be varied in N stages from just one FET group #1 to all of the FET groups #1 to #N.

With this kind of high-frequency amplifier, all of the switches 22-2 to 22-N are switched over to the side of the operating gate voltage Vg-on when the transmission power is set to maximum by the transmission power control information S3, all of the FET groups #1 to #N are in operating mode and the amplifier is capable of high level output.

When the transmission power is lowered due to the transmission power control information S3, a prescribed number of the switches 22-2 to 22-N are switched to the side of the off gate voltage Vg-off is accompaniment with this lowering stage and only the FET groups for which the gate voltage is the on gate voltage Vg-on are on. When the transmission power is set to be a minimum, all of the switches 22-2 to 22-N are switched to the side of the off gate voltage Vg-off based on the value of this transmission power control information S3 and only the FET group #1 is operating.

This is to say that in this embodiment, the amount of drain current can be controlled in N stages from the maximum amount Idmax to the minimum amount Idmax/N in response to the transmission power level and the amount of drain current finely controlled in response to the transmission power level.

The efficiency results and the low power consumption results for this amplifier can therefore be made larger.

Third Embodiment

5. Example structure (3) of a transmission power amplifier as a high-frequency amplifier of the embodiment Next, a third embodiment of a high-frequency amplifier comprised of the bias controller 17 and the transmission power amplifier 15 shown in FIG. 9 will be described using FIG. 14.

The high-frequency amplifier is constructed from a drain bias controller 17D and a transmission power amplifier 15.

Figure 13:
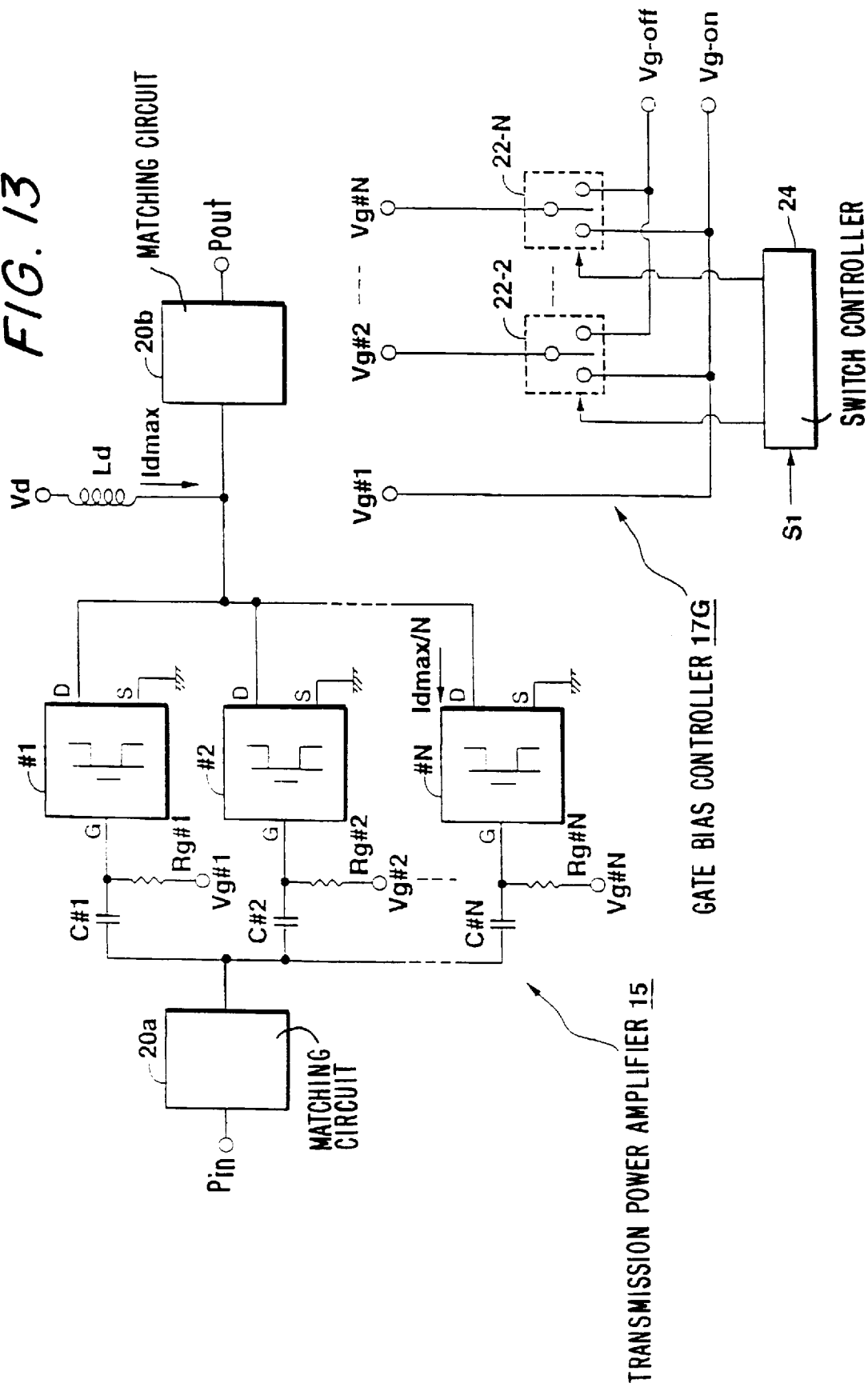
FIG. 13 is a view illustrating a high-frequency amplifier of a second embodiment of the present invention.

In this embodiment, N FET groups #1 to #N are formed in the same way as the embodiment of FIG. 13. However, a difference with the embodiment of FIG. 13 is that the drain voltages Vd#1 to Vd#N for each of the FET groups #1 to #N are controlled by the drain bias controller 17D.

The transmission power amplifier 15 of this high-frequency amplifier comprises matching circuits 20a and 20b, FET groups #1, #2, . . . #N, DC blocking capacitors C#1, C#2, . . . C#N, and a gate resistor Rg.

Each of the gate electrodes of each of the groups #1, #2, . . . #N are connected and a fixed gate voltage Vg (operating gate voltage Vg-on) is applied via the gate resistors Rg.

Each of the drain electrodes of each of the FET groups #1, #2, . . . #N are DC isolated by DC blocking capacitors C#1, C#2, . . . C#N and connected with respect to high frequencies.

A drain current of Idmax/N can then be made to flow by applying drain voltages Vd#1 to Vd#N to each of the drain electrodes.

Each of the drain voltages Vd#1 to Vd#N for each of the FET groups #1 to #N are provided by the drain bias controller 17D.

An operating drain voltage Vd-on and 0V (Vd-off) are obtained at the drain bias controller 17D and an operating drain voltage Vd-on is provided for the FET group #1 as the drain voltage Vd#1.

On the other hand, the operating drain voltage Vg-on and the voltage of 0V are provided to each of the terminals of the single-pole two-way switches 25-2 to 25-N, with the switches 25-2 to 25-N being connected to each of the electrodes of the respective FET groups #2 to Vd#N via high-frequency choke coils Ld#2 to Ld#N. Namely, whichever of the operating drain voltage Vg-on and the voltage 0V is present as the voltage selected at each of the respective switches 25-2 to 25-N is provided to the FET groups #2 to #N as the drain voltages Vd#2 to Vd#N.

The high-frequency choke coils Ld#1 to Ld#N are for providing isolation so that the high-frequency signals of the drain electrodes do not flow in the DC bias circuit. These may therefore be replaced with a lumped constant element or a quarter wavelength high impedance line etc. having a sufficiently large impedance.

Each of the switches 25-2 to 25-N can be individually switched over by the switch controller 27 in response to the values of the respective items of transmission power control information S3. This is to say that, in this embodiment, the FET groups providing the operation gate voltages Vg-on can be varied in N stages from just one FET group #1 to all of the FET groups #1 to #N.

Further, the FET groups of the FET groups #2 to #N for which an operating drain voltage Vd-on is provided are in an operating condition and the drain current becomes Idmax/N. On the other hand, FET groups provided with a voltage of 0V are not in an operating state and a drain current does not flow.

With this kind of high-frequency amplifier, all of the switches 25-2 to 25-N are switched to the side of the operating drain side voltage Vd-on when the transmission power is set to maximum by the transmission power control information S3, all of the FET groups #1 to #N go into an operating state and the amplifier circuit is capable of outputting at high levels.

When the transmission power is lowered due to the transmission power control information S3, a prescribed number of the switches 25-2 to 25-N are switched over to the 0V voltage side so as to accompany this lowering stage and the prescribed number of FET groups for which the drain voltage Vd is 0V are made to be off.

When the transmission power is set to by a minimum, all of the switches 25-2 to 25-N are switched over to the 0V side based on the value of the transmission power control information S3 and only the FET group #1 is made to operate.

This is to say that in this embodiment, the amount of drain current can be controlled in N stages from the maximum amount Idmax to the minimum amount Idmax/N in response to the transmission power level and the amount of drain current finely controlled in response to the transmission power level.

The efficiency results and the low power consumption results for this amplifier can therefore be made larger.

Figure 15:
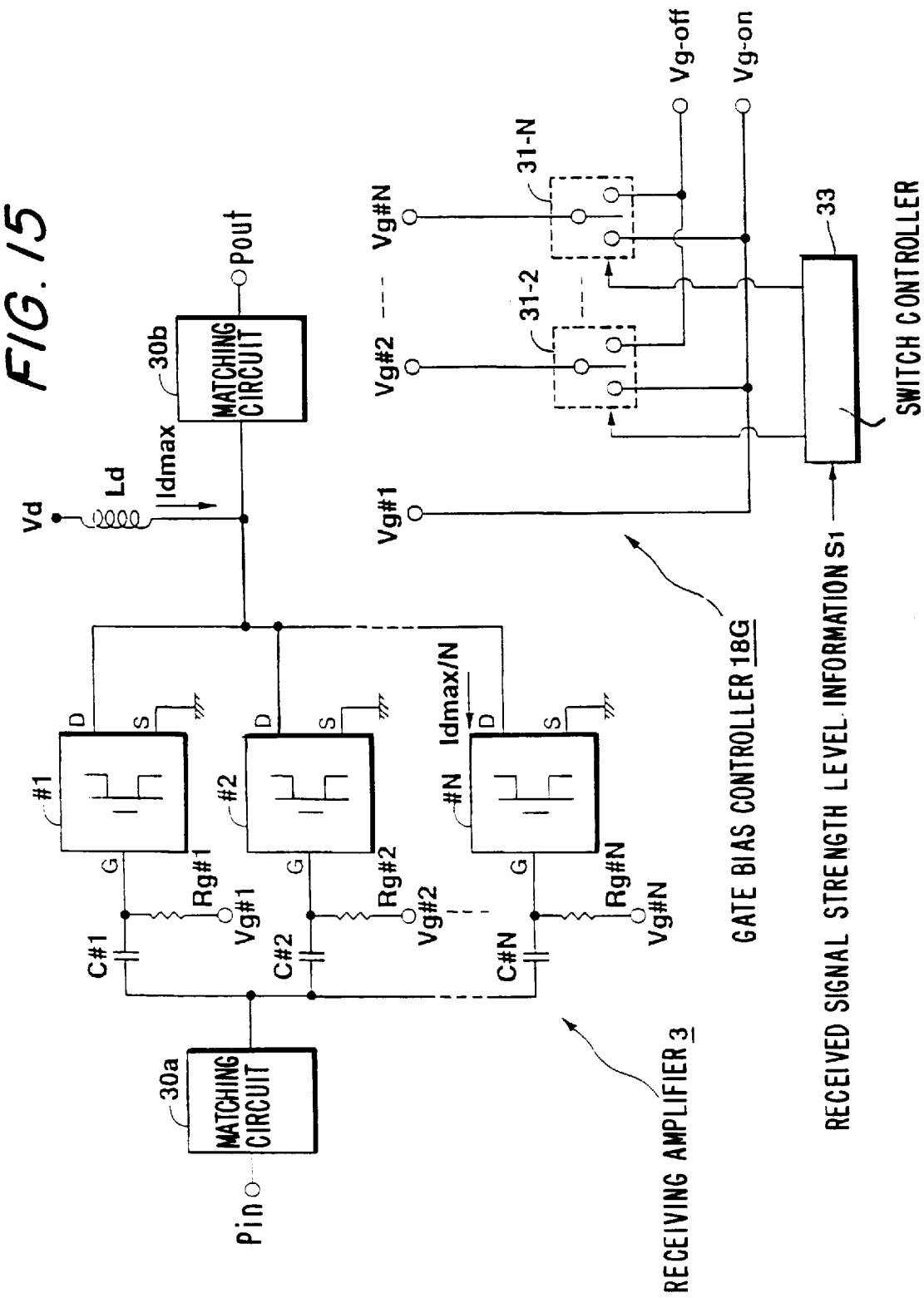
FIG. 15 is a view illustrating a high-frequency amplifier of a fourth embodiment of the present invention.

6. Example (1) of a construction for a receiving amplifier as a high-frequency amplifier of the embodiment An embodiment of the high-frequency amplifier comprising the receiving amplifier 3 and the bias controller 18 of FIG. 15 will now be described.

This high-frequency amplifier comprises the gate bias controller 18G and the receiving amplifier 3.

The receiving amplifier 3 of this high-frequency amplifier comprises matching circuits 30a and 30b, FET groups #1, #2, . . . #N, DC blocking capacitors C#1, C#2, . . . C#N, gate resistors Rg#1, Rg#2, . . . Rg#N, and a high-frequency choke coil Ld.

Each of the gate electrodes of the FET groups #1, #2, . . . #N are DC isolated by DC blocking capacitors C#1, C#2, . . . C#N and are connected with respect to high frequencies. The respective gate electrodes of the FET groups #1, #2, . . . #N are connected by gate resistors Rg#1, Rg#2, . . . Rg#N.

Further, the drain electrodes of the FET groups #1, #2, . . . #N are connected and a fixed drain voltage Vd is applied via a high-frequency choke coil Ld.

Namely, this receiving amplifier 3 is constructed in a similar way to the transmission power amplifier 15 of FIG. 13 described above.

Gate voltages Vg#1 to Vg#N for each of the FET groups #1 to #N are provided by the gate bias controller 18G, with this gate bias controller 18G also being constructed in the same way as the gate bias controller 17G of FIG. 13. The gate voltages Vg#2 to Vg#N for the FET groups #2 to #N are controlled to be one of either the operating gate voltage Vg-on or the off gate voltage Vg-off which is lower than the pinch of voltage Vp by individually switching over switches 31-2 to 31-N connected to gate resistors Rg#2 to Rg#N of the FET groups #2 to #N using the switch controller 33. In this way, each of the FET groups #2 to #N can be set-up to be in operating states or non-operating states.

In this case, the switch controller 33 carries out the changeover setting for each of the switches 31-2 to 31-N in response to the value of the received signal strength level information S1.

FET groups providing the operating gate voltage Vg-on can be changed in N stages from just the FET group #1 to all of the FET groups #1 to #N by setting the switching conditions of each of the switches 31-2 to 31-N based on the received signal strength level information S1.

With this high-frequency amplifier, the amount of drain current can be switched over between a maximum of Idmax to a minimum of Idmax/N in N stages in response to the strength of the received signal, that is in response to the input signal level for the receiving amplifier 3. This is to say that in the case of a low input level, a sufficient efficiency results and low power consumption results can be obtained by reducing the drain current in response to this level.

Figure 16:
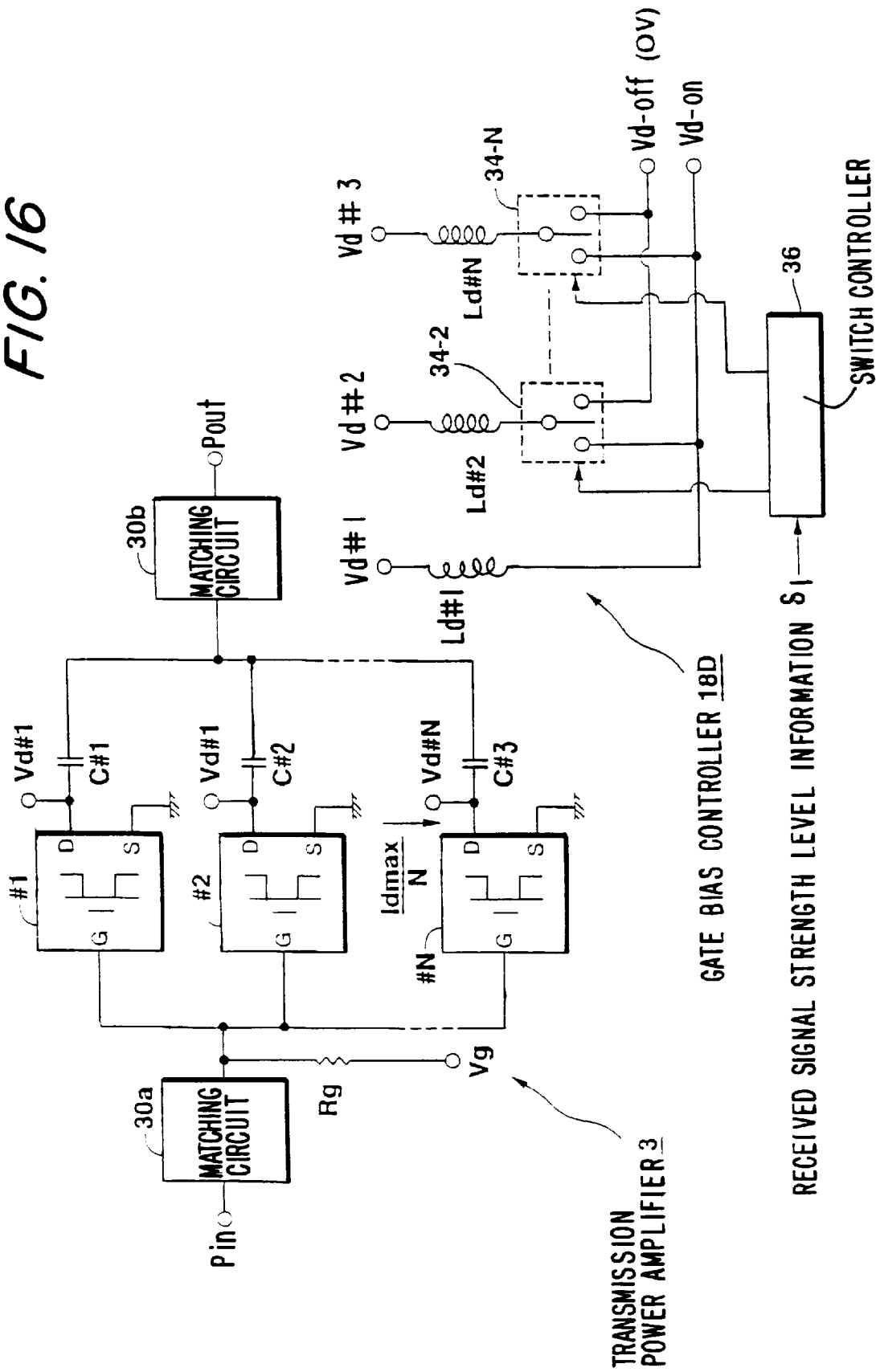
FIG. 16 is a view illustrating a high-frequency amplifier of a fifth embodiment of the present invention.

7. Example structure (2) of a receiving amplifier as a high-frequency amplifier for the embodiment The following is a description of a second embodiment of a high-frequency amplifier comprising the receiving amplifier 3 and the bias controller 18D of FIG. 16.

This high-frequency amplifier is constructed from a drain bias controller 18D and a receiving amplifier 3.

The receiving amplifier 3 of this high-frequency amplifier comprises matching circuits 30a and 30b, FET groups #1, #2, . . . #N, DC blocking capacitors C#1, C#2, . . . C#N, and a gate resistor Rg.

Each of the gate electrodes of the FET groups #1, #2, . . . #N are connected and a fixed gate voltage Vg (operating gate voltage Vg-on) is applied via the gate resistor Rg.

Further, each of the drain electrodes of the FET groups #1, #2, . . . #N are DC isolated by the DC cutting capacitors C#1, C#2, . . . C#N and are connected with respect to high frequencies. Respective drain currents Idmax/N are then made to flow by applying drain voltages Vd#1 to Vd#N to each of the drain electrodes.

Figure 14:
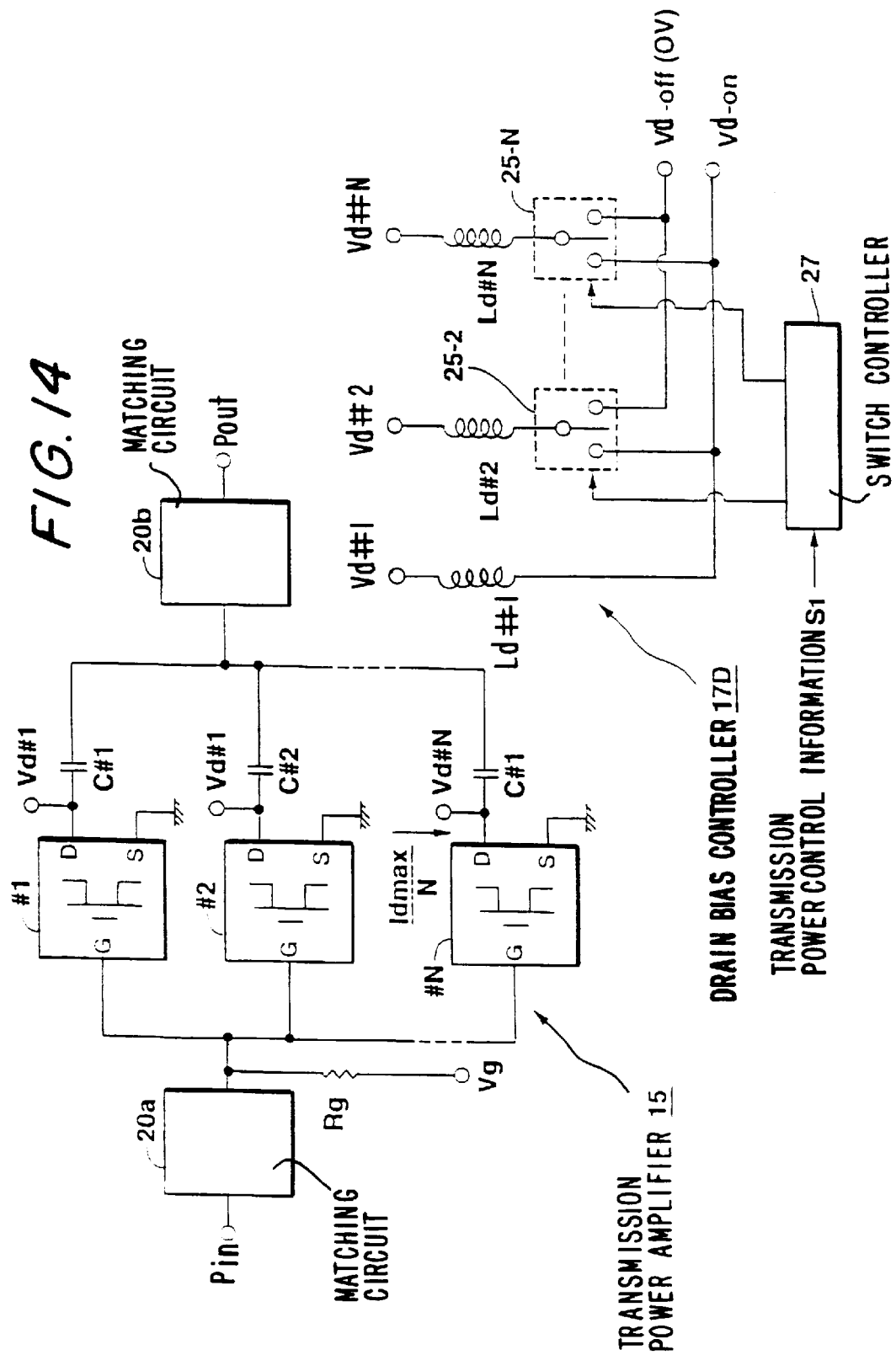
FIG. 14 is a view illustrating a high-frequency amplifier of a third embodiment of the present invention.

This is to say that the receiving amplifier 3 has the same structure as the transmission power amplifier 15 of FIG. 14.

The drain voltages Vd#1 to Vd#N for each of the FET groups #1 to #N are provided by the drain bias controller 18D, with this drain bias controller 18D also being constructed in the same way as the drain bias controller 17D of FIG. 14. The respective drain voltages Vd#2 to Vd#N for the FET groups #2 to #N are controlled to be either of an operating drain voltage Vd-on or a voltage of 0V by individually switching over the switches 34-2 to 34-N connected to the drain electrodes of the FET groups #2 to #N via high-frequency choke coils Ld#2 to Ld#N using the switch controller 36. In this way, each of the FET groups #2 to #N can be set to an operating state or a non-operating state.

In this case, the switch controller 36 carries out switching between each of the switches 34-2 to 34-N in response to the value of the received signal strength level information S1.

By switching the states of each of the switches 34-2 to 34-N based on the received signal strength level information S1, the FET groups providing the operating drain voltages Vd-on can be changed in N stages from the case of only the FET group #1 to the case of all of the FET groups #1 to #N.

With this high-frequency amplifier, the amount of drain current can be switched over between a maximum of Idmax to a minimum of Idmax/N in N stages in response to the strength of the received signal, that is in response to the input signal level for the receiving amplifier 3. This is to say that in the case of a low input level, a sufficient efficiency results and low power consumption results can be obtained by reducing the drain current in response to this level.

8. Example (1) of FET group setting occurring in high-frequency amplifier of the embodiment High-frequency amplifiers were described as each of the aforementioned practical examples. However, the group dividing and setting method of the FET groups occurring in the high-frequency amplifier of the present invention will now be described.

An example is given in a first setting example 1 where each of the FET groups of the high-frequency amplifier are formed using the same number of FET units.

Figure 17A:
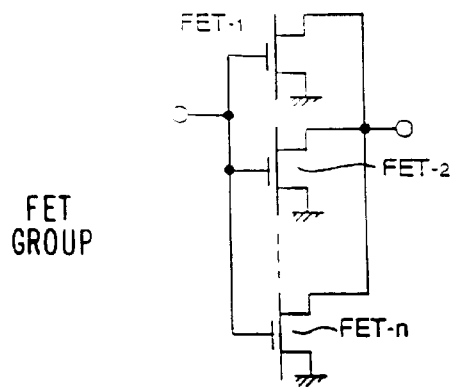
FIG. 17A, FIG. 17B and FIG. 17C are views illustrating a case in the above embodiments where each of the FET groups are formed using the same number of FETs.
Figure 17B:
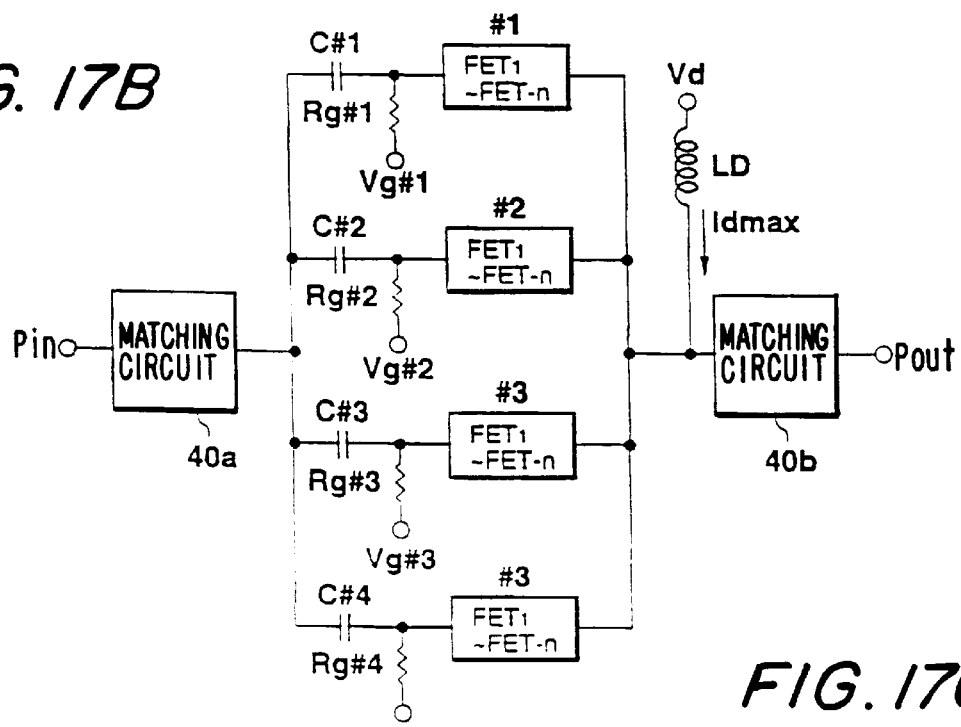

An example is considered where each FET group is formed using n FET units (FET-1 to FET-n) as shown in FIG. 17A and the amplifier has four FET groups #1 to #4 as shown in FIG. 17B.

With this amplifier, the input power Pin is amplified at the FET groups #1 to #4 via a matching circuit 40a and outputted as the output power Pout via a matching circuit 40b. The gate voltages Vg#2 to Vg#4 for the FET groups #2 to #4 are then set up by switching over the switches 41, 42 and 43 of the gate bias controller of FIG. 17C in the same way as mentioned for the embodiments of FIG. 11, FIG. 13 and FIG. 15.

In this case, the FET groups #1 to #4 each comprise n FET units and the drain current flowing when each of the FET groups #1 to #4 are in an operating state becomes Idmax/4.

Four stages of control are therefore possible with operation control using the switching of the switches 41, 42 and 43 by the switch controller 44: the case where all of the switches 41, 42 and 43 are at the side of the operating gate voltage Vg-on, the case where two of the switches 41, 42 and 43 are at the side of the operating gate voltage Vg-on, the case where one of the switches 41, 42 and 43 are at the side of the operating gate voltage Vg-on, and the case where all of the switches 41, 42 and 43 are at the side of the off gate voltage Vg-off.

Figure 17C:
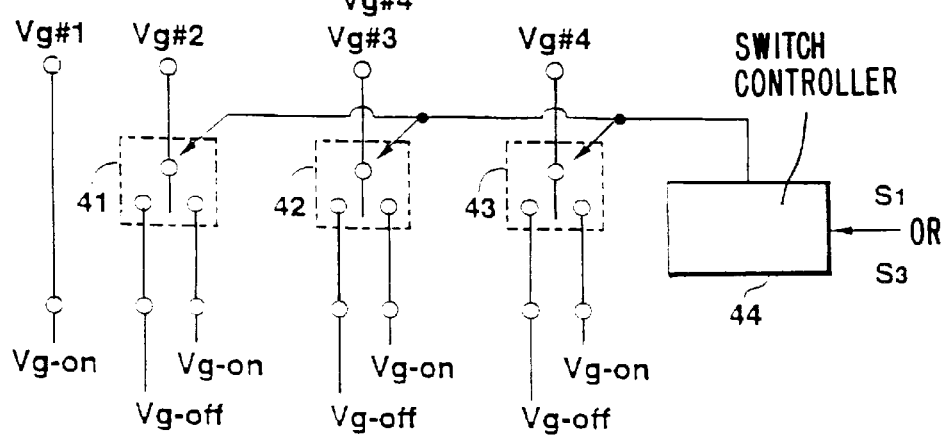

Namely, when each of the FET groups comprise the same number of FET units as shown in FIG. 17A, FIG. 17B and FIG. 17C drain current may be controlled in the same number of stages as the FET group number.

9. Example (2) of setting the FET groups occurring in the high-frequency amplifier of the embodiment In FIG. 18A and FIG. 18B, and example is given where the number of FET units comprising each of the FET groups is different.

Figure 18A:
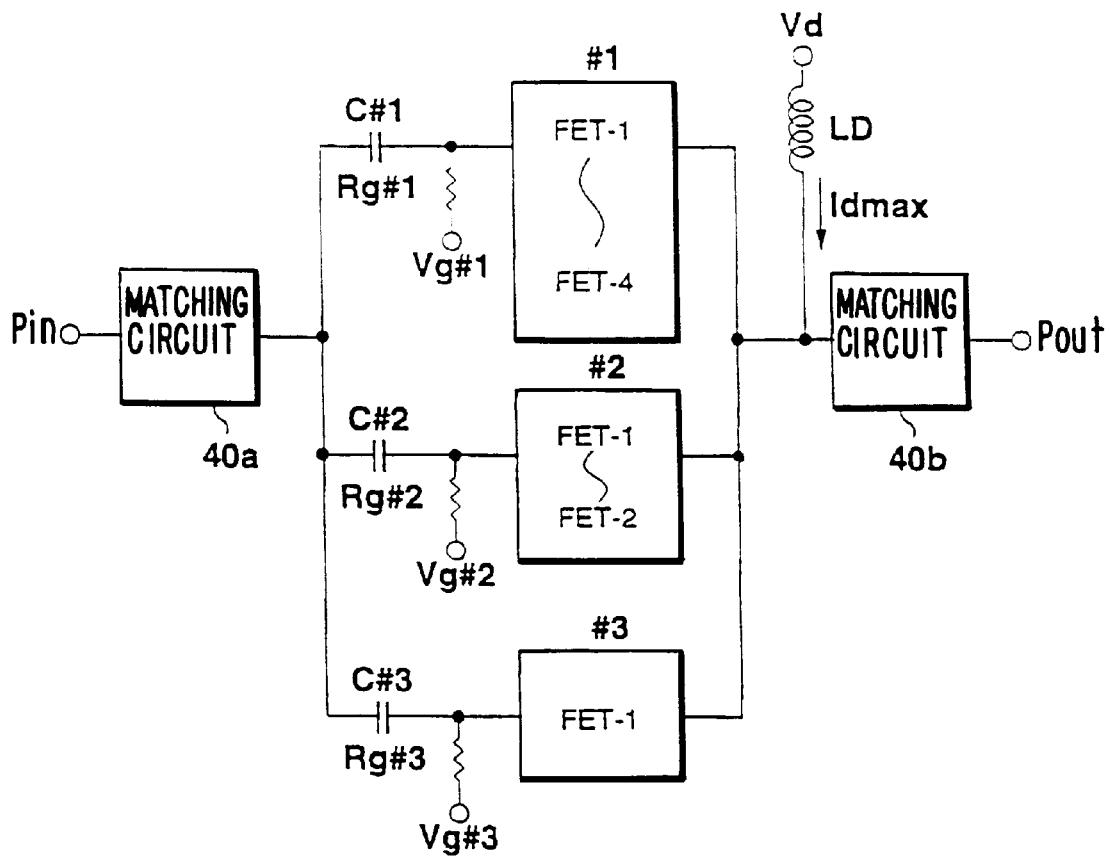
FIG. 18A and FIG. 18B are views illustrating the case in the above embodiments where each of the FET groups are not formed using the same number of FETs.

In this case three FET groups #1 to #3 are provided as shown in FIG. 18A, with FET group #1 comprising four FET units (FET-1 to FET-4), FET group #2 comprising two FET units (FET-1, FET-2) and FET group #3 comprising only one FET unit (FET-1).

Figure 18B:
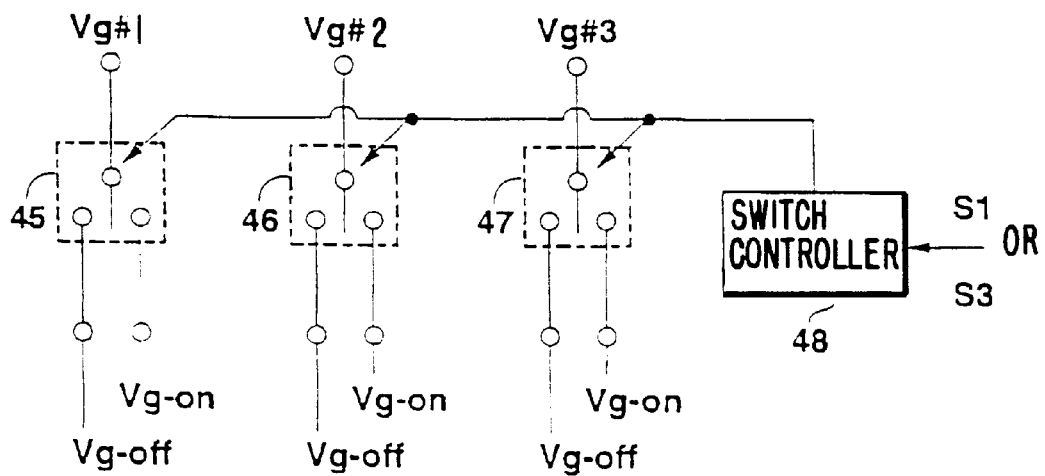

Each of the gate voltages Vg#1 to Vg#3 for each of the FET groups #1 to #3 are set by switching over the switches 45, 46 and 47 of the gate bias controller of FIG. 18B. The switch controller 48 can, however, control the amount of drain current in seven stages by setting combinations of the switches 45, 46 and 47 to the side of the operating gate voltage Vg-on.

This seven stage control is shown in FIG. 19. Regarding the FET groups #1 to #3 in the drawing, "on" shows when an operating gate voltage Vg-on is provided to an FET group and this group is in operation and "off" shows when an off gate voltage Vg-off is being provided and the FET group is not in operation.

This is to say that when all of the switches 45, 46 and 47 are set to the side of the operating gate voltage Vg-on the FET groups #1 to #3 are all "on" and the drain current is the maximum Idmax.

Further, when just the switch 47 is put to the side of the off gate voltage Vg-off, the FET groups #1 and #2 go "on", that is six out of seven of the FET units are in operation and the overall drain current is ($6/7$) Idmax.

By selecting the operating FET groups in the way shown in the table of FIG. 19, the drain current can be switched between ($5/7$) Idmax, ($4/7$) Idmax, ($3/7$) Idmax, ($2/7$) Idmax and ($1/7$) Idmax.

Namely, when the number of FET units in each FET group is made not to be the same, control is possible for a larger number of stages than the number of groups by assigning a weighting to each of the groups.

This group dividing and setting example has been described using the practical example of gate bias control, but this would be the same if the practical example of drain bias control was given.

Figure 20A:
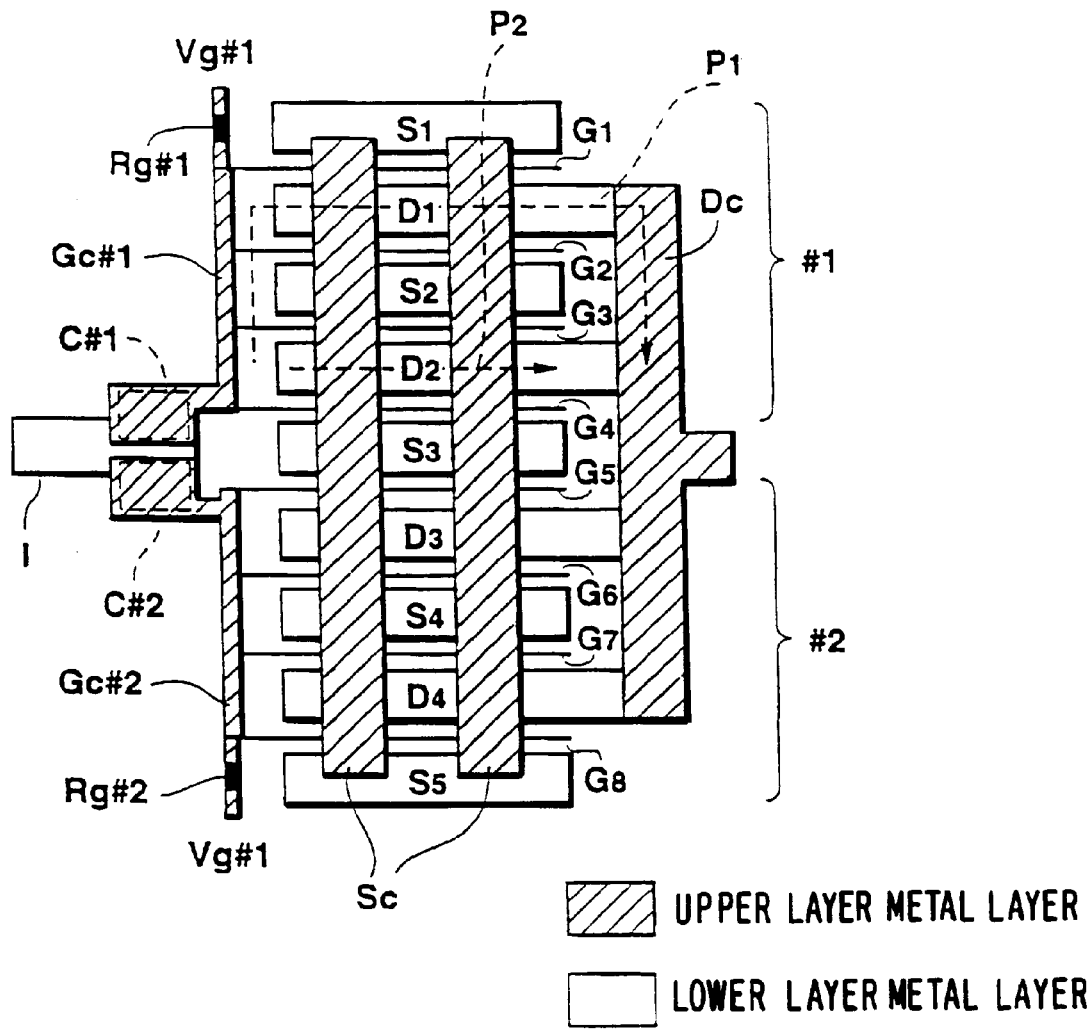
FIG. 20A and FIG. 20B are views illustrating an FET structure adopted in the above embodiments.
Figure 20B:
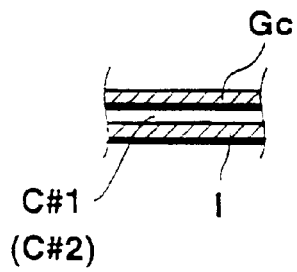

10. Example (1) of structure of FETs occurring in high-frequency amplifier of embodiment Next, the FET structure for the embodiment is shown in FIG. 20A and FIG. 20B. This FIG. 20A shows an example structure where eight FET units are divided into two FET groups #1 and #2 each comprising four FET units.

The signal from the front stage matching circuit is inputted from the input line I. The input line I is connected to two gate lines Gc#1 and Gc#2 formed from an upper metal layer. However, the kind of dielectric layer shown in FIG. 20B is interposed between each of the gate lines Gc#1 and Gc#2 and the input line I so that DC blocking capacitors C#1 and C#2 are formed.

Further, a gate voltage Vg#1 is applied at the gate line Gc#1 via a portion comprising the gate resistor Rg#1, with a gate voltage Vg#2 similarly being applied at the gate line Gc#2 via a portion comprising a gate resistor Rg#2.

Four gate electrodes G1 to G4 are then derived from the gate line Gc#1, with four gate electrodes G5 to G8 being derived from the gate line Gc#2.

Drain electrodes D1 to D4 are formed as the lower layer metal layer and are all connected to a drain line Dc present at an upper layer metal layer.

Further, source electrodes S1 to S5 are formed as the lower layer metal and are all connected to a source line Sc present at the upper layer metal, with this source line Sc being connected to ground.

In this case, drain electrodes and source electrodes are positioned on both sides of each of the gate electrodes G1 to G8 so as to form eight FET units (FET-1, FET-2, . . . FET-8). Further, the gate electrodes G1 to G4 and the gate electrodes G5 to G8 are DC isolated and, connected with respect to high frequencies and have gate voltages Vg#1 and Vg#2 applied uniquely so as to form FET group #1 and FET group #2, respectively.

By using this kind of structure, the high-frequency amplifiers in each of the aforementioned embodiments can be realized. It goes without saying that modifications in the structure regarding settings for the dividing of the FET groups or the number of FET units can be performed. Further, this example corresponds to an embodiment where the gate bias is controlled. However, an embodiment where the drain bias is controlled, the drain line side of each of the FET groups are isolated with respect to DC and connected with respect to high frequencies and unique drain voltages Vd#1 to Vd#N are applied may also be adopted.

11. Example (2) of structure of FETs occurring in high-frequency amplifier of embodiment However, in the case shown in FIG. 20A where the FET units are divided into groups in the upper part and lower part of the drawing, one undesirable point occurs.

Consider the case where the FET group #2 of FIG. 20A is off and only the FET group #1 is operating. The high-frequency signal inputted at this time is divided between the FET units of the FET group #1 and is transferred from each of the gate electrodes G1 to G4 to the drain electrode Dc. At this time, as shown by the arrows P1 and P2 of FIG. 20A, there is a difference in the distance for the signal (P1) for which the propagation distance is a maximum and the distance for the signal (P2) for which the propagation distance is a minimum, with a signal phase difference therefore occurring. This can cause deterioration such as lowering of the gain etc. to occur in the high-frequency characteristics.

Figure 21:
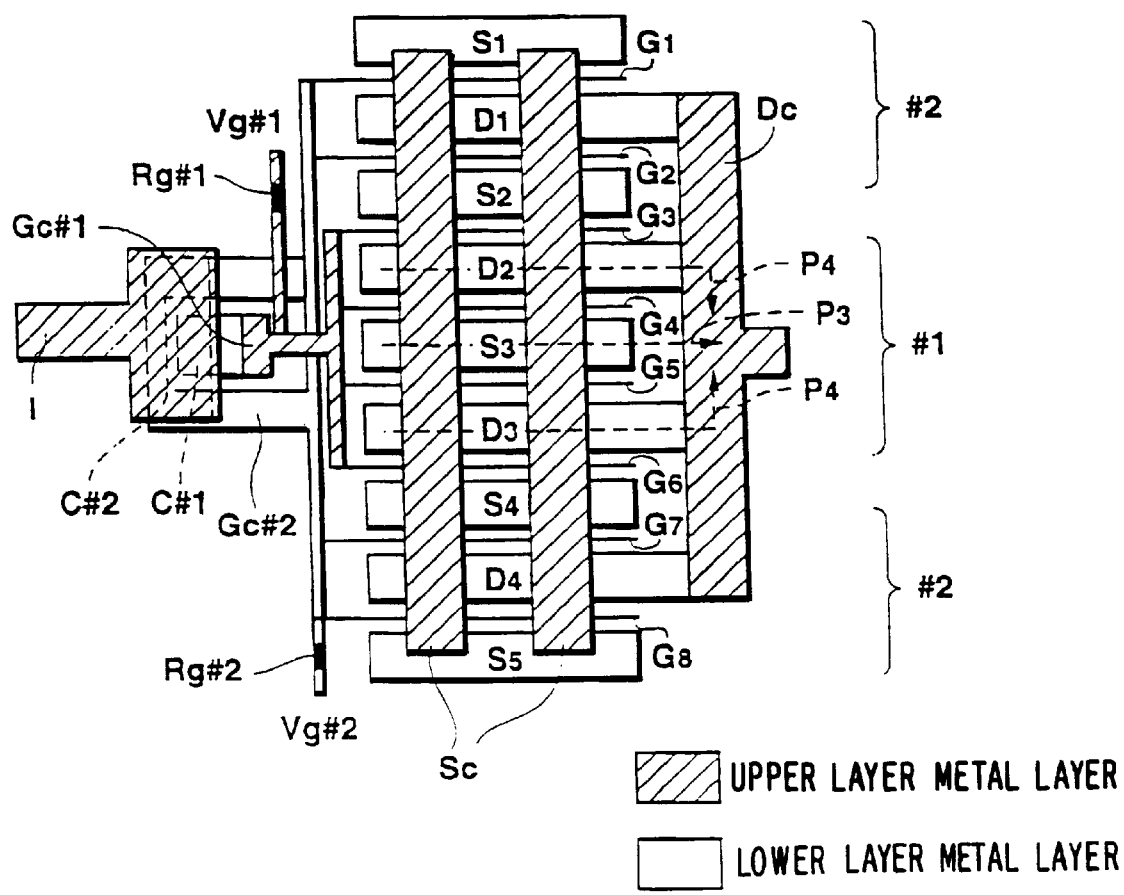
FIG. 21 is a view illustrating a further FET structure adopted in the above embodiments.

The structure of FIG. 21 was therefore considered for the FETs.

In the structure of FIG. 21, the gate line Gc#2 for the FET group #2 is divided into two on both sides of the gate line Gc#1 for the FET group #1. Gate electrodes G3 to G6 are then derived from the gate line Gc#1 positioned at the center and gate electrodes G1, G2, G7 and G8 are derived from the gate line Gc#2 positioned on both sides.

This is to say that FET units positioned symmetrically with respect to the direction of propagation of the inputted high-frequency signal are included in the same FET group.

In this case, considering the case where only the FET group #1 is operating, the difference in the distances for the signal (P4) for which the distance of propagation is longest and the signal (P3) for which the distance of propagation is shortest can be made small, with the gain characteristics being improved as a result.

12. Example of a variable bias switch used in the embodiment

Relay switches or semiconductor switch IC's etc. can be used as the switches (21, 22-2, 22-N, 25-2, 25-N, 31-2, 31-N, 34-2, 34-N, 41 to 43, and 45 to 47) employed in the bias control circuits 17 (17G, 17D) and 18 (18G, 18D) of the embodiment.

Figure 22:
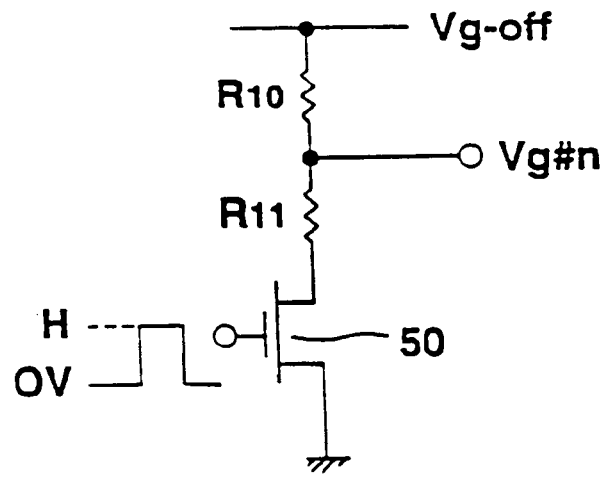
FIG. 22 is a view illustrating a structure of a switch adopted in the embodiments.

An example of the switch used in the gate bias controller circuits 17G and 18G is shown in FIG. 22.

This switch comprises an enhancement mode FET 50 and resistors R10 and R11.

In this case, the gate voltage Vg#n of the FET group #n of the amplifier can be controlled by providing 0V or a positive voltage logic signal to the gate electrode of the FET 50.

Figure 23:
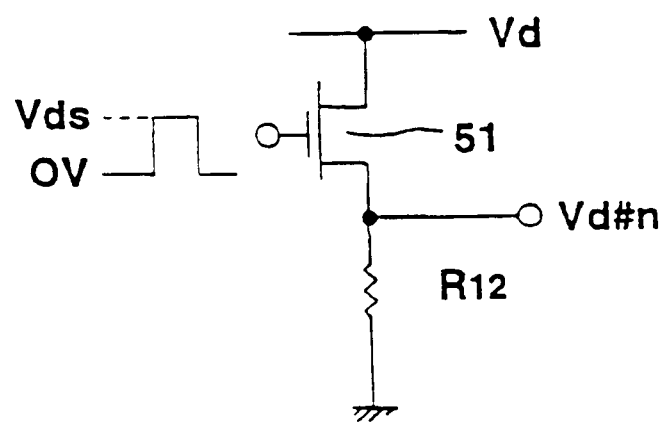
FIG. 23 is a view illustrating a structure of a switch adopted in the embodiments.

An example of the switch used in the drain bias controller circuits 17D and 18D is shown in FIG. 23.

This switch comprises an FET 51 and a resistor R12.

In this case, the drain voltage Vd#n of the FET group #n of the amplifier can be controlled by providing 0V or a +Vds[V] logic signal to the gate electrode of the FET 51. The structure of the switch examples of FIG. 22 and FIG. 23 is simple and can be integrated into the circuit using the same manufacturing process as is used for the FETs used in the amplifier. The entire high-frequency amplifier therefore becomes smaller, with this contributing to lower costs.

13. Effects of the embodiment

Regarding the effects of this embodiment, FIG. 24 shows the characteristic of the added efficiency PAE for the output power Pout of the high-frequency amplifier where half of the total number of FET units are taken as FET group #1, ¼ are taken as FET group #2 and the remaining ¼ are taken as FET group #3.

In this case, FET group #1 is off when the output power Pout=22.5 dBm, and FET groups #1 and #3 are off when the output power Pout=14.5 dBm.

As becomes clear from FIG. 24, efficiency at the time of low power input is dramatically improved as compared with the efficiency characteristic (characteristic ①) of the amplifier when there is no control, as shown by characteristic ③ for when FET group #1 is off and characteristic ④ for when FET groups #1 and #3 are off.

For example, the efficiency improves from 1.7% to 7% when the output power Pout=10 dBm. If this is converted to low power consumption, this is an improvement from 588 mW to 143 mW, and low power consumption becomes approximately ¼.

Figure 1:
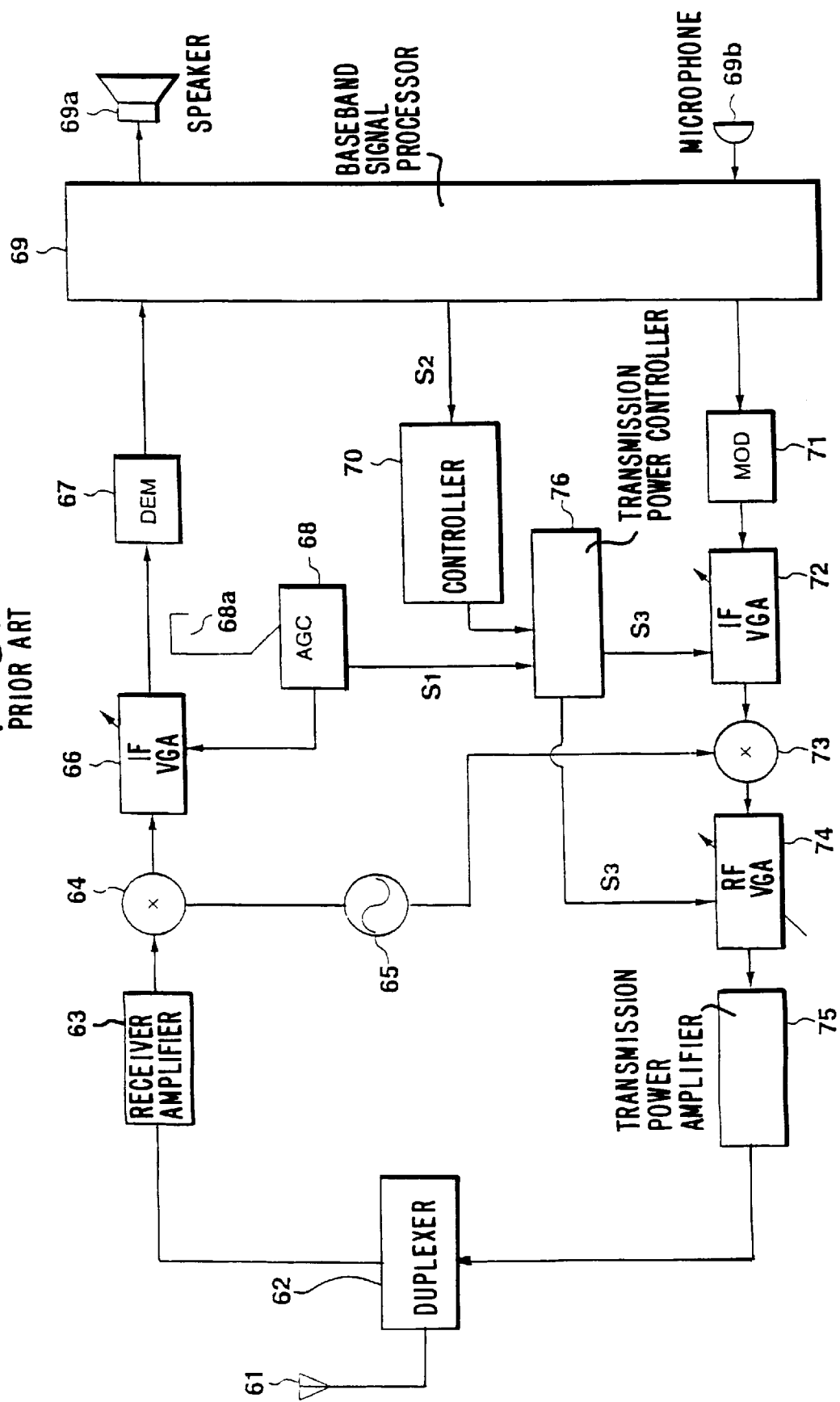
FIG. 1 is a block view of a transmitting and receiving device.
Figure 2:
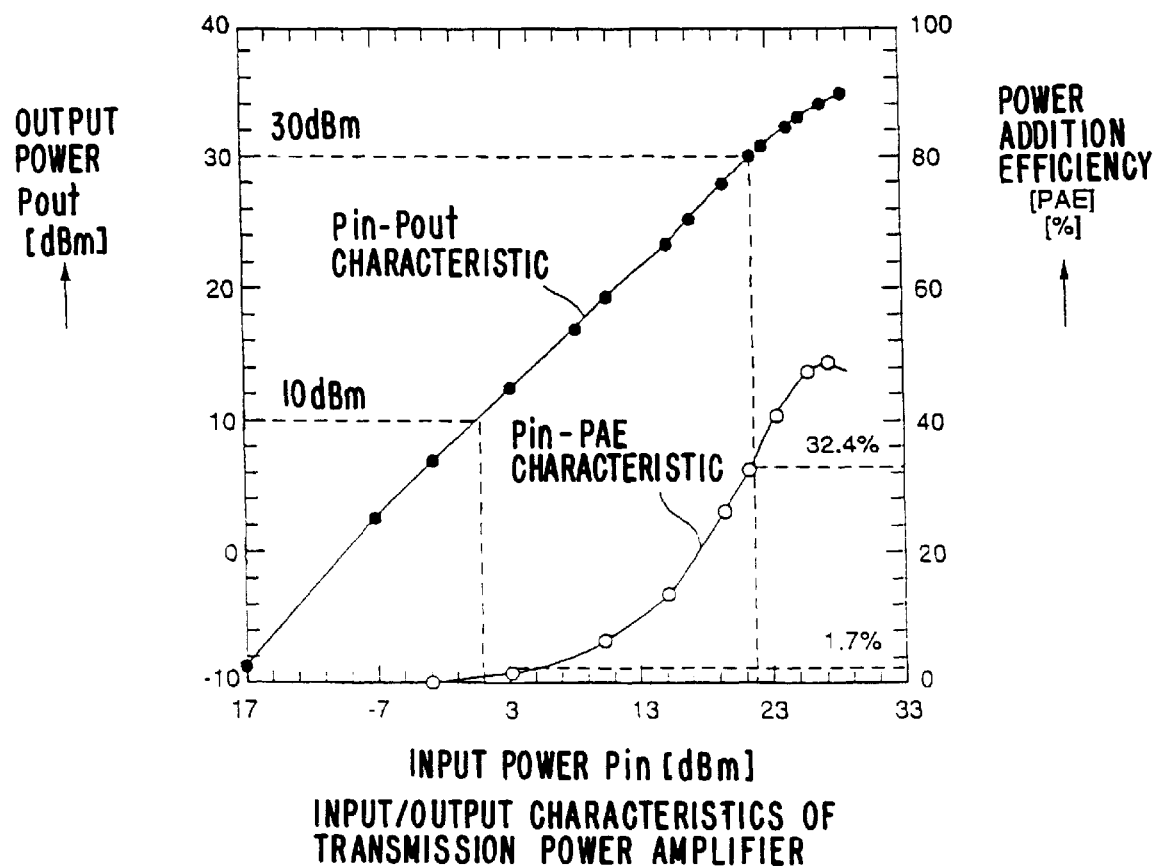
FIG. 2 is a view illustrating the input characteristics of a related transmission power amplifier.
Figure 3:
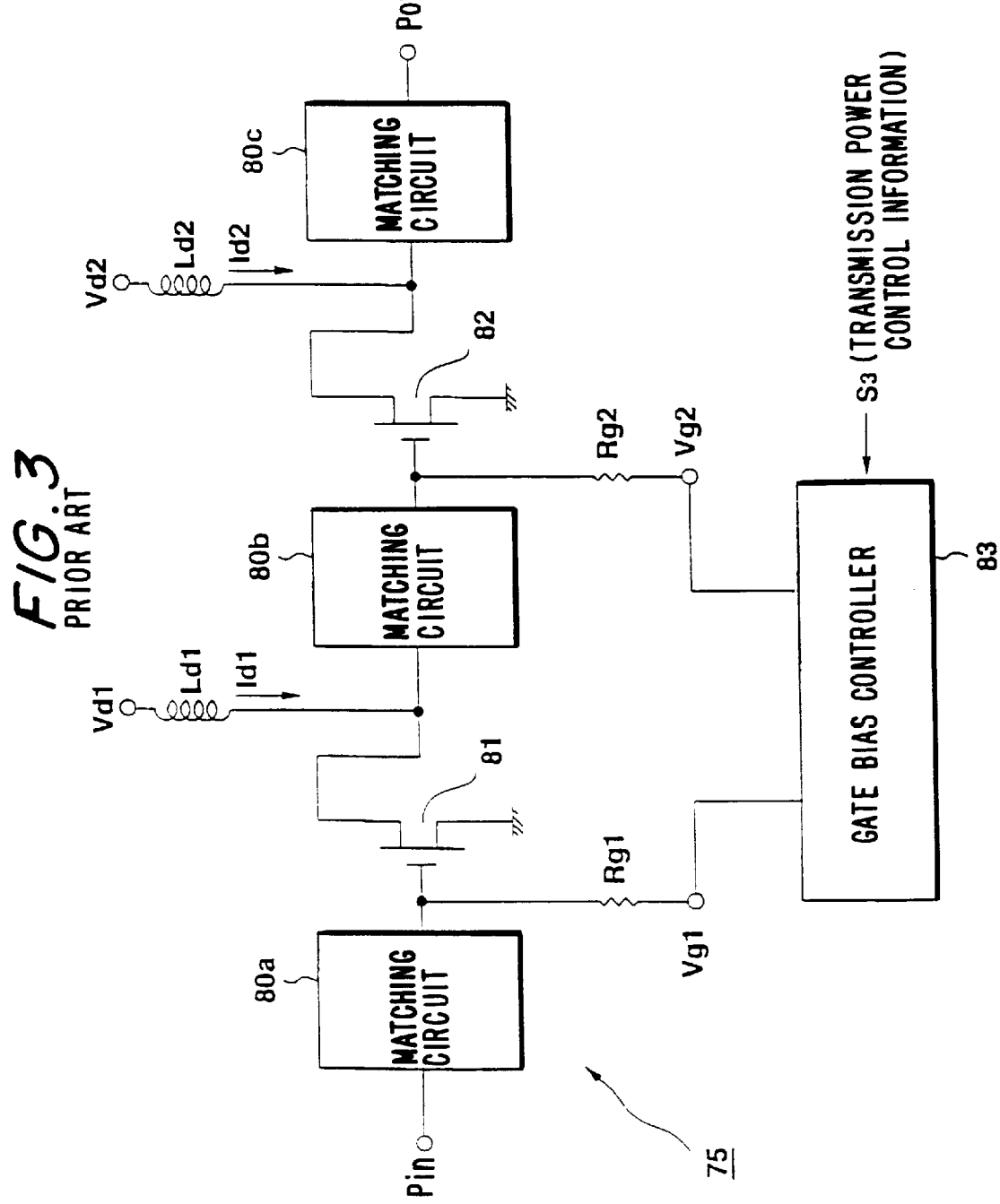
FIG. 3 is a view illustrating the related transmission power amplifier.
Figure 4:
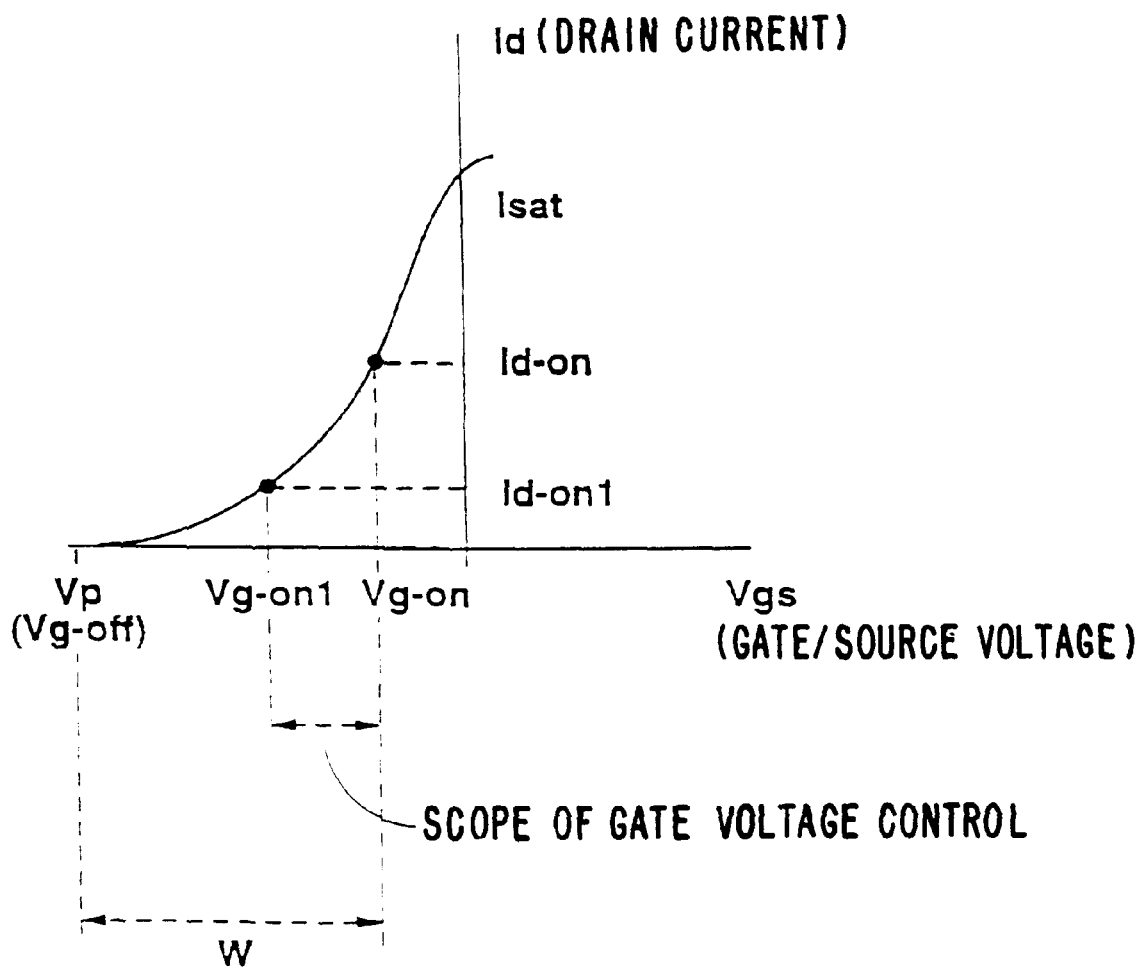
FIG. 4 is a view illustrating the gate voltage control operation occurring in the related transmission power amplifier.
Figure 5:
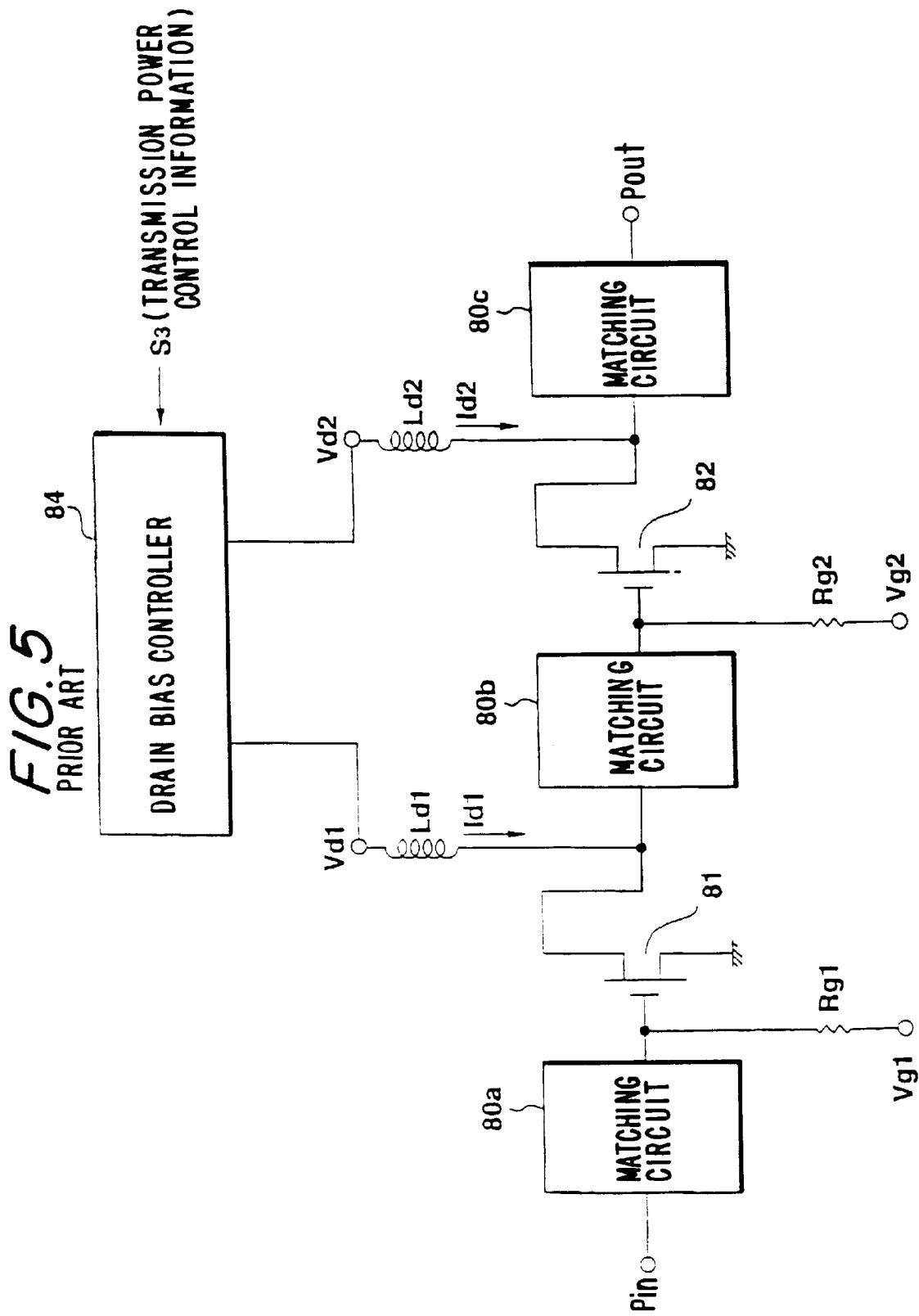
FIG. 5 is a view illustrating another related transmission power amplifier.

As described for the related example using FIG. 4, the scope of the control voltage had to be small in the previously known gate bias control method (Vg-on to Vg-on1 of FIG. 4) and the low power consumption results also therefore had to be small. Further, stability in the control voltage level is essential because differences in both of the control voltages Vg-on and Vg-on1 directly influence the amplifier characteristics.

According to this embodiment, looking at the scope of the control voltage, the scope becomes from Vg-on to an off gate voltage Vg-off less than the pinch-off voltage Vp. This becomes the wide scope shown by W of FIG. 4. Further, fluctuations in the off gate voltage Vg-off have almost no influence on the amplifier characteristics (in reality, the off gate voltage Vg-off only has to be a voltage capable of putting the FET off and does not have to be controlled to be a strict value).

Further, when the gate voltage was set to be Vg-on1 in the known gate bias control method, the FET operation class was close to being class B, with this being related to lowering in the gain and distortion characteristic deterioration. Because of this, a narrower scope was adopted for the control voltage and the low power consumption results were small.

In the case of this embodiment, with regards to this, more stable gain and distortion characteristics are obtained regardless of the output power because the operating class of the FETs in a normal operating state does not fluctuate.

The same effect as above can also be said for an embodiment of a drain bias control method.

Figure 6:
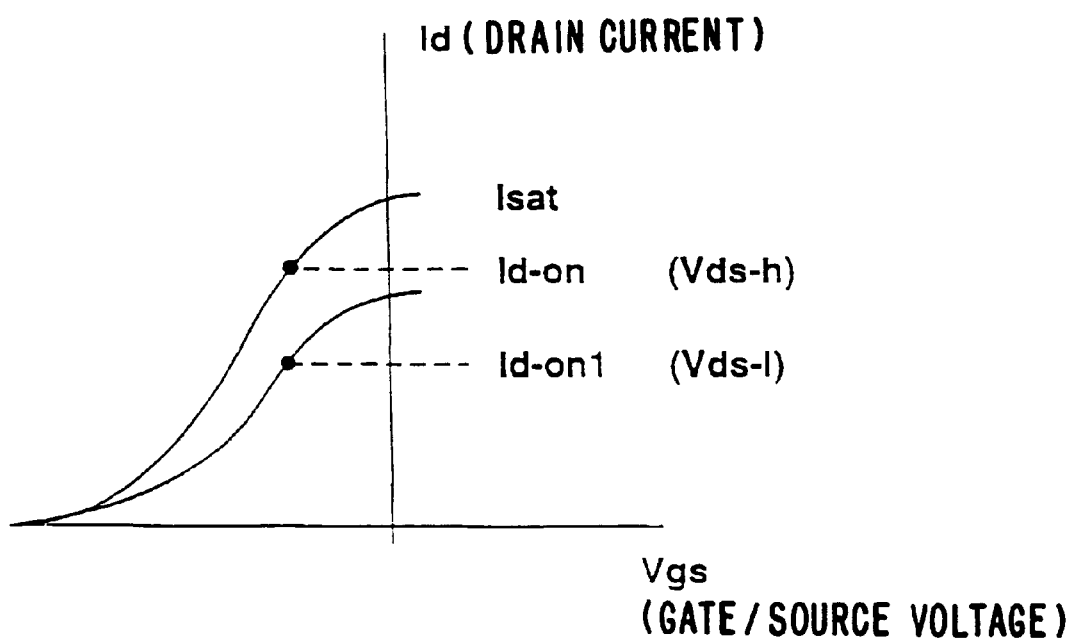
FIG. 6 is a view illustrating the drain voltage control operation occurring at the other related transmission power amplifier.
Figure 7:
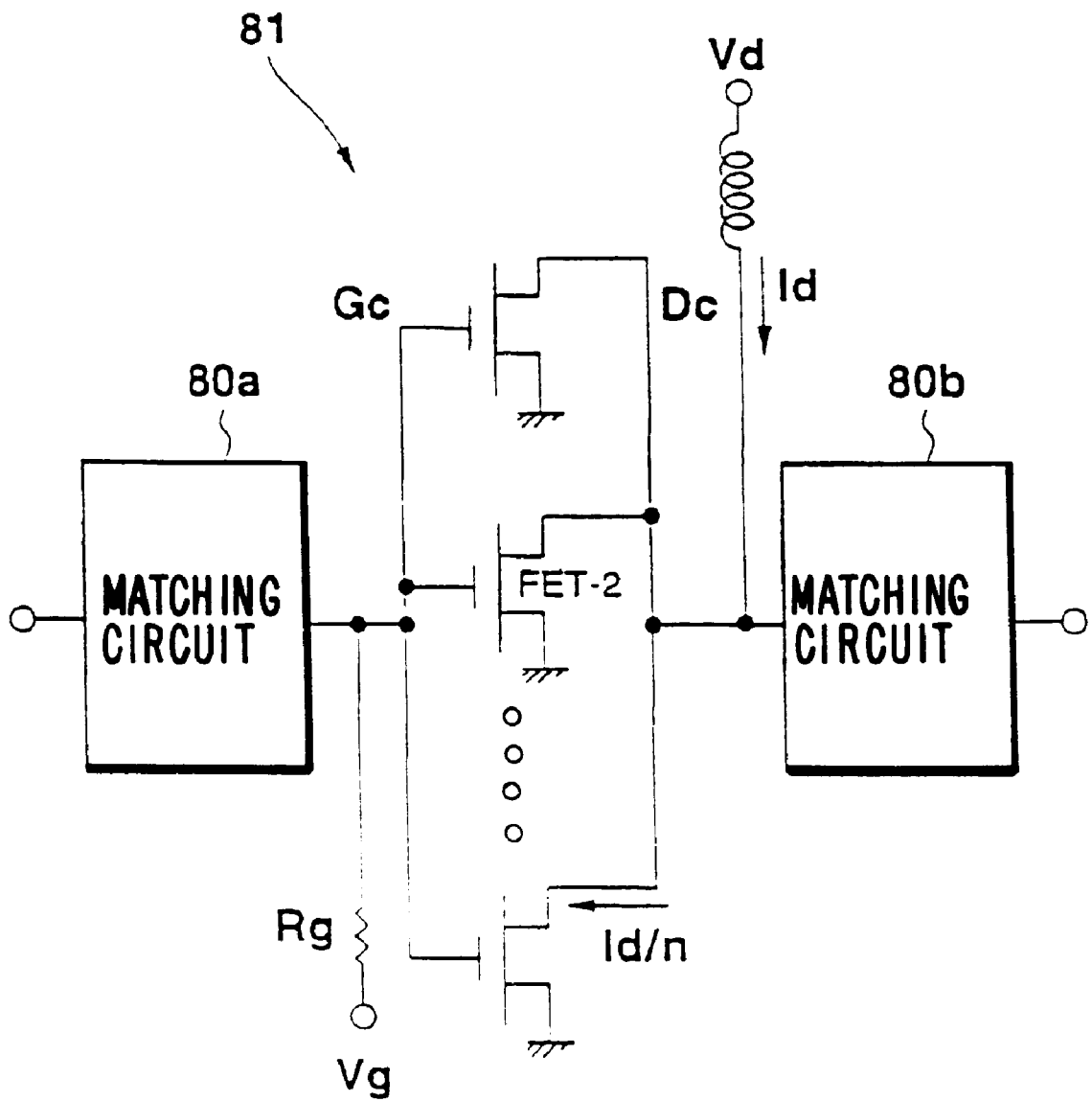
FIG. 7 is a view illustrating an FET structure occurring in a related transmission power amplifier.
Figure 8:
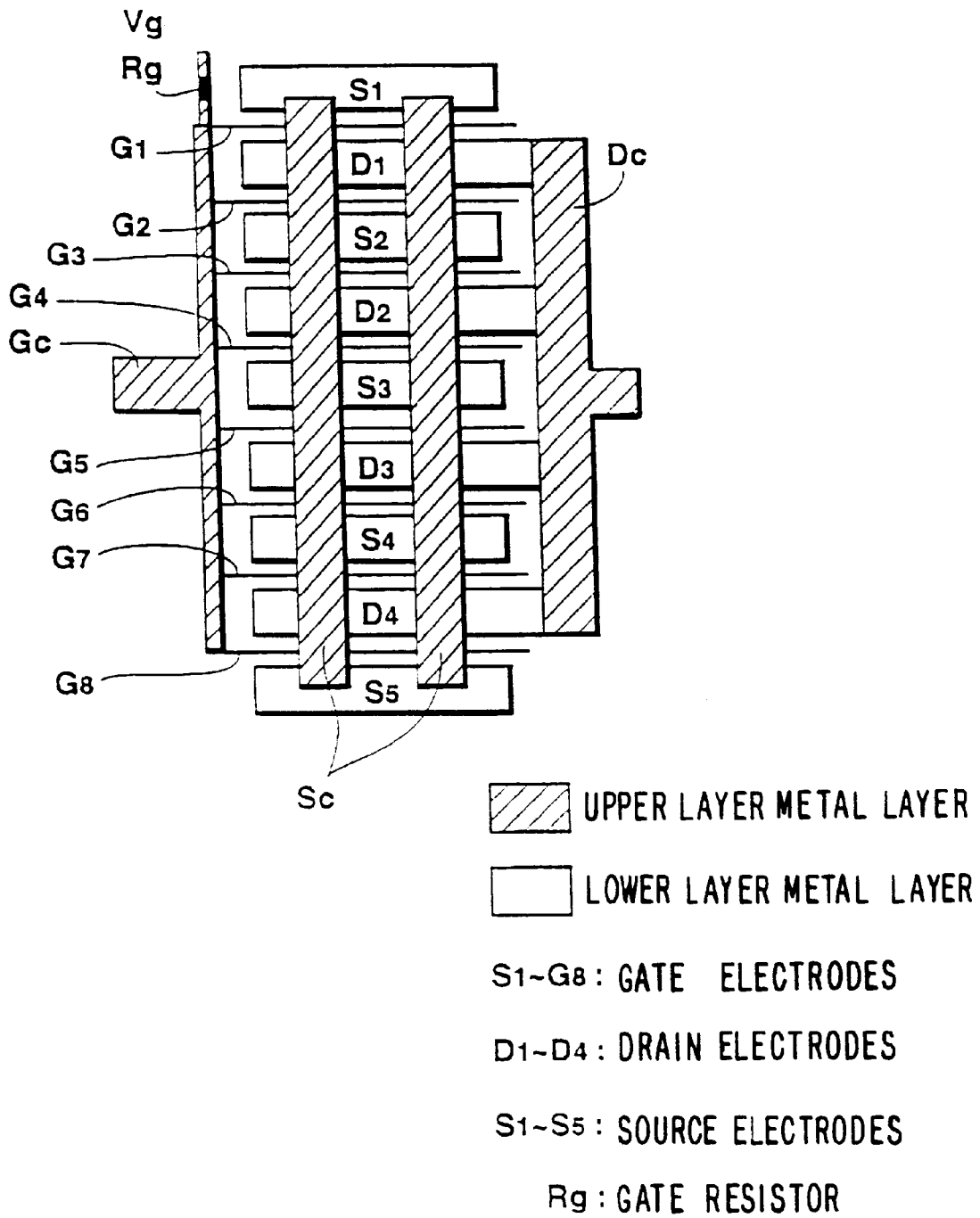
FIG. 8 is another view illustrating the FET structure occurring at a related transmission power amplifier.

This is to say that in the known drain bias control method, two kinds of differing voltage levels Vds-h and Vds-1 were required as the drain voltage, as shown in FIG. 6 and fluctuations in both of the control voltages Vds-h and Vds-1 had a large influence on the amplifying characteristics.

Regarding this, in this embodiment, the control voltage is either Vd-on or 0V. It is only necessary to generate one kind of voltage level and the scope of the control voltage is widened.

Further, when the drain voltage is taken to be Vds-1 in the known method, reductions in the gain and deterioration in the distortion characteristics occur because of fluctuations in the bias conditions. However, in this embodiment, the operating FET bias conditions are stably maintained and gain lowering and distortion characteristic deterioration does not occur.

In the above embodiment, a description was given where FETs were used as the amplifying elements, but the same effects are obtained if bipolar transistors are used.

Further, this embodiment was explained with regards to a single stage amplifier, but the present invention can also be applied to a cascaded multi-stage amplifier.

In particular, low power consumption can also be achieved for the drive stage by cascade connecting a number of amplifiers.

Moreover, a wireless communications terminal was given as an example of a transmitting and receiving device in FIG. 9 and FIG. 10 but the present invention can also be generally applied to communications devices for executing transmission power control and communications devices for changing receiving signal levels.

The present invention is also particularly suited to systems for carrying out wide dynamic range transmission power control in mobile stations for maintaining circuit capacity in wireless communications terminals such as digital cellular terminals or satellite communications terminals etc.

The high-frequency amplifier of the present invention is constructed from first to Nth FET groups constructed from one or a plurality of source-grounded FET units with drain electrodes electrically connected together and with gate electrodes connected with respect to high frequencies while being DC isolated, and a gate bias controller capable of switching over voltage levels provided individually to one or some of the respective first to Nth FET groups. Alternatively, the high-frequency amplifier of the present invention can be constructed from first to Nth FET groups constructed from one or a plurality of source-grounded FET units with gate electrodes electrically connected together and with drain electrodes connected with respect to high frequencies while being DC isolated, and a gate bias controller capable of switching over voltage levels provided individually to one or some of the respective first to Nth FET groups.

Because of this, by switching over the bias of individual FET groups so as to control each FET group to be in an operating state or a non-operating state, deterioration of the gain and distortion characteristics of the amplifier is avoided and sufficiently low power consumption at the time of low power output can be achieved.

By constructing this high-frequency amplifier in such a manner that the number of FET units constructing each of the first to Nth FET groups is not the same, a larger number of control stages can be set up and finer control is possible in response to the output power even without increasing the number of FET groups.

Further, an amplifier can be realized where deterioration of the gain characteristics can be prevented by setting up the first to Nth FET groups in such a manner that each of the FET units facing along the direction of propagation of the inputted high-frequency signal are included in the same FET group.

Moreover, with the transmitting device of the present invention transmission power control can be executed and unnecessary power consumption can be reduced at the time of low power output by individually switching over the bias voltages for each of the FET groups of the high-frequency amplifier between an operating voltage and an off voltage based on high-frequency transmission signal level information.

Still further, wasteful power consumption at the time of low level input can be reduced in this receiving device by switching over the bias voltages of each of the FET groups of the high-frequency amplifier individually between an operating voltage and an off voltage based on received signal strength information.

What is claimed is:

1. A radio frequency amplifier for amplifying a radio frequency signal comprising:

power amplifying means for amplifying said radio frequency signal based on at least one of a signal strength level of said radio frequency signal and an instruction signal included in said radio frequency signal, said power amplifying means including a plurality of active element groups connected in parallel, wherein each of said plurality of active element groups comprises one or more active elements for amplifying a signal, with input terminals of said one or more active elements being combined to form a single input terminal and output terminals of said one or more active elements being combined to form a single output terminal;

power control means for receiving said at least one of said signal strength level and said instruction signal and producing a power control information signal; and bias control means connected to a respective control structure of each of said one or more active elements for individually controlling bias voltages of said active elements of said plurality of active element groups based on said power control information signal from said power control means, wherein each of said plurality of active element groups is separately biased so that a number of said plurality of active element groups that are biased to amplify said radio frequency signal is selectable by said bias control means such that a gain of said plurality of active element groups is selectable.

2. The radio frequency amplifier according to claim 1, wherein said one or more active elements comprise FETs, said control structure is a gate of each of said FETs, and said bias control means controls respective gate bias voltages of said FETs.

3. The radio frequency amplifier according to claim 1, wherein said one or more active elements comprise FETs, said control structure is a drain of each of said FETs, and said control means controls respective drain voltages of said FETs.

4. The radio frequency amplifier according to claim 2, wherein each of said plurality of active element groups comprises an equal number of FETs.

5. The radio frequency amplifier according to claim 3, wherein each of said plurality of active element groups comprises an equal number of FETs.

6. The radio frequency amplifier according to claim 2, wherein two or more groups of said plurality of active element groups comprise different numbers of FETs.

7. The radio frequency amplifier according to claim 3, wherein two or more groups of said plurality of active element groups comprise different numbers of FETs.

8. The radio frequency amplifier according to claim 6, wherein each of said plurality of active element groups comprises 2n FETs, where n is an integer that is a whole number.

9. The radio frequency amplifier according to claim 7, wherein each of said plurality of active element groups comprises 2n FETs, where n is an integer that is a whole number.

10. The radio frequency amplifier according to claim 2, wherein said FETs comprising said one or more active elements are located symmetrically with respect to a direction of propagation of said signal along said single input terminal.

11. The radio frequency amplifier according to claim 3, wherein said FETs comprising said one or more active elements are located symmetrically with respect to a direction of propagation of said signal along said single input terminal.

12. The radio frequency amplifier according to claim 2, wherein said bias control means includes FET switches.

13. The radio frequency amplifier according to claim 3, wherein said bias control means includes FET switches.

14. A transmitter for transmitting radio waves comprising:

baseband signal processing means for processing a baseband signal;

modulating means for modulating a predetermined signal using said baseband signal; and power amplifying means for amplifying a radio frequency signal comprising a plurality of active element groups, wherein each of said groups comprises one or more FETs for amplifying said signal, with input terminals of said one or more FETs combined to form a single input terminal and output terminals of said one or more FETs combined to form a single output terminal; and bias control means for controlling gate bias voltages of said FETs of said plurality of active element groups, wherein each of said plurality of groups is separately biased so that a number of groups that are biased to amplify said signal is selectable by said bias control means, whereby a gain of said plurality of active element groups is selectable.

15. A transmitter for transmitting radio waves comprising:

baseband signal processing means for processing a baseband signal;

modulating means for modulating a predetermined signal using said baseband signal; and power amplifying means for amplifying a radio frequency signal comprising a plurality of active element groups, wherein each of said groups comprises one or more FETs for amplifying said signal, with input terminals of said one or more FETs combined to form a single input terminal and output terminals of said one or more FETs combined to form a single output terminal; and bias control means for controlling drain voltages of said FETs of said plurality of active element groups, wherein drain voltages for said FETs in each of said active element groups are individually controlled, so that a number of groups that amplify the signal is selectable by said bias control means, whereby a gain of said plurality of active element groups is selectable.

16. A receiver for receiving a radio frequency signal comprising:

radio frequency amplifying means for amplifying received radio frequency signal comprising a plurality of active element groups, wherein each of said groups comprises one or more FETs for amplifying said signal, with input terminals of said one or more FETs combined to form a single input terminal and output terminals of said one or more FETs combined to form a single output terminal;

bias control means for controlling gate bias voltages of said FETs of said plurality of active element groups, wherein each of said plurality of groups is separately biased so that a number of groups that is biased to amplify said signal is selectable by said bias control means, whereby a gain of said plurality of active element groups is selectable;

demodulating means for demodulating an output signal of said radio frequency amplifying means; and baseband signal processing means for processing an output signal of said demodulating means.

17. A receiver for receiving a radio frequency signal comprising:

radio frequency amplifying means for amplifying a received radio frequency signal comprising a plurality of active element groups, wherein each of said groups comprises one or more FETs for amplifying said signal, with input terminals of said one or more FETs combined to form a single input terminal and output terminals of said one or more FETs combined to form a single output terminal;

bias control means for controlling drain voltages of said FETs of said plurality of active element groups, wherein drain voltages for said FETs in each of said active element groups is individually controlled, so that a number of groups that amplify the signal is selectable by said bias control means, whereby a gain of said plurality of active element groups is selectable;

demodulating means for demodulating an output signal of said radio frequency amplifying means; and baseband signal processing means for processing an output signal of said demodulating means.

18. A transceiver for transmitting and receiving radio signals comprising:

a transmitting section including:

baseband signal processing means for processing a baseband signal;

modulating means for modulating a predetermined signal using said baseband signal;

power amplifying means for amplifying a radio frequency signal having a first plurality of active element groups, wherein each of said groups includes one or more FETs for amplifying said signal, with input terminals of said one or more FETs combined to form a single input terminal and output terminals of said one or more FETs combined to form a single output terminal; and bias control means for controlling gate bias or drain voltages of said FETs of said first plurality of active element groups, wherein each of said plurality of groups is separately biased, so that a number of groups that are biased to amplify said signal is selectable by said bias control means, whereby a gain of said plurality of active element groups is selectable; and a receiving section including:

a second plurality of active element groups, wherein each of said groups includes one or more FETs for amplifying a received signal, with input terminals of said one or more FETs combined to form a single input terminal and output terminals of said one or more FETs combined to form a single output terminal;

bias control means for controlling gate bias voltages of said FETs of said second plurality of active element groups, wherein each of said plurality of groups is separately biased, so that a number of groups that are biased to amplify said signal is selectable by said bias control means, whereby a gain of said plurality of active element groups is selectable;

demodulating means for demodulating an output signal of said second plurality of active element groups; and baseband signal processing means for processing an output signal of said demodulating means.

19. A method of controlling a gain of a radio frequency amplifier comprising the steps of:

sending a command for turning on or off signals to a plurality of bias controlling lines;

adjusting bias voltages on said bias control lines so that selected parallel-connected amplifying units are activated to amplify an input signal and so that deselected parallel-connected amplifying units are deactivated, in accordance with said turning on or off of said sending step; and providing an input signal to said selected and deselected parallel-connected amplifying units, wherein a gain applied to said input signal depends on a number of said selected units.

* * * * *